United States Patent
Tiebout et al.

(10) Patent No.: US 11,322,837 B2
(45) Date of Patent: May 3, 2022

(54) CALIBRATION OF ACTIVE PHASED ARRAY SYSTEM USING BEAMFORMING RFIC BUILT-IN-TEST EQUIPMENT

(71) Applicant: Infineon Technologies AG, Neubiberg (DE)

(72) Inventors: Marc Tiebout, Finkenstein (AT); Daniele Dal Maistro, Villach (AT); Ivan Tsvelykh, Munich (DE); Samo Vehovc, Unterhaching (DE); Peter Pfann, Sonnblickstr (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 256 days.

(21) Appl. No.: 16/799,089

(22) Filed: Feb. 24, 2020

(65) Prior Publication Data

US 2021/0159594 A1 May 27, 2021

Related U.S. Application Data

(60) Provisional application No. 62/941,065, filed on Nov. 27, 2019.

(51) Int. Cl.
| | |
|---|---|
| *H01Q 3/26* | (2006.01) |
| *G01R 29/08* | (2006.01) |
| *G01R 29/10* | (2006.01) |
| *H04B 17/12* | (2015.01) |

(52) U.S. Cl.
CPC ......... *H01Q 3/267* (2013.01); *G01R 29/0892* (2013.01); *G01R 29/10* (2013.01); *H04B 17/12* (2015.01)

(58) Field of Classification Search
CPC .... H01Q 3/267; G01R 29/0892; G01R 29/10; H04B 17/12
See application file for complete search history.

(56) References Cited

U.S. PATENT DOCUMENTS

| | | | |
|---|---|---|---|
| 10,484,038 B1 * | 11/2019 | Kimball | H04B 1/44 |
| 2019/0372218 A1 * | 12/2019 | Vehovc | H04B 17/12 |
| 2020/0227824 A1 * | 7/2020 | Abdalla | H01Q 21/0025 |
| 2021/0242948 A1 * | 8/2021 | Kong | H01Q 3/2605 |

OTHER PUBLICATIONS

Inac, Ozgur et al., "A Phased Array RFIC with Built-In Self-Test Capabilities", IEEE Transactions on Microwave Technology and Techniques, vol. 60, No. 1, Jan. 2012, pp. 139-148.

Nafe, Ahmed et al., "An In-Situ Self-Test and Self-Calibration Technique Utilizing Antenna Mutual Coupling for 5G Multi-Beam TRX Phased Arrays", TH2C-2, IEEE MTT-S International Microwave Symposium (IMS) Jun. 2-7, 2019, 4 pages.

* cited by examiner

*Primary Examiner* — Daniel Munoz
(74) *Attorney, Agent, or Firm* — Slater Matsil, LLP

(57) ABSTRACT

A calibration method for a phased array system comprises sequentially injecting a tone into a first plurality of antenna elements of an antenna array, receiving the tone by a second plurality of antenna elements of the antenna array through parasitic coupling between the first plurality of antenna elements and the second plurality of antenna elements, measuring a plurality of phase errors between the first plurality of antenna elements and the second plurality of antenna elements, populating a lookup table with the plurality of phase errors, and calibrating a plurality of phase shifters associated with a plurality of channels in the phased array system using the plurality of phase errors in the lookup table.

20 Claims, 18 Drawing Sheets

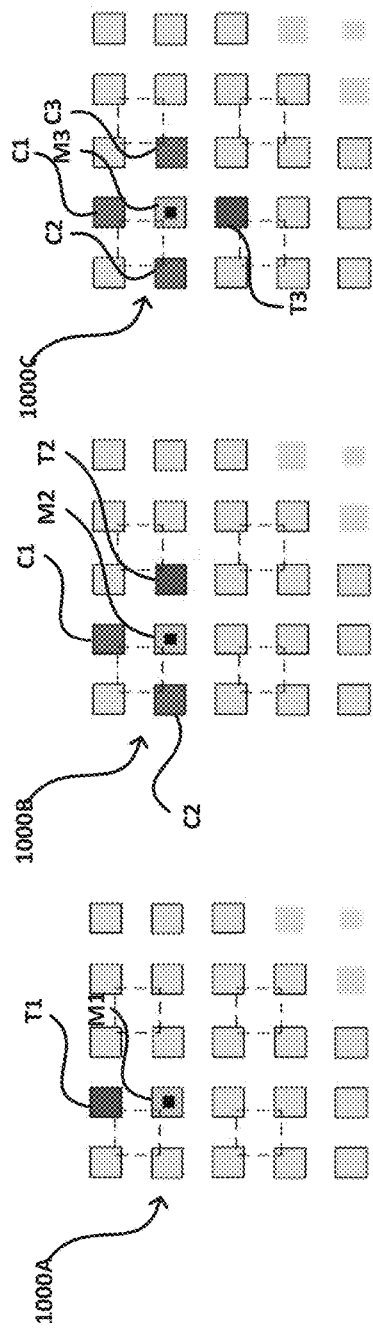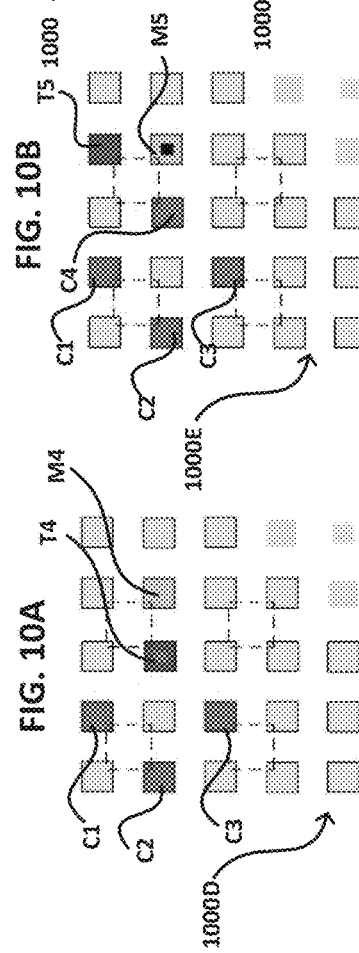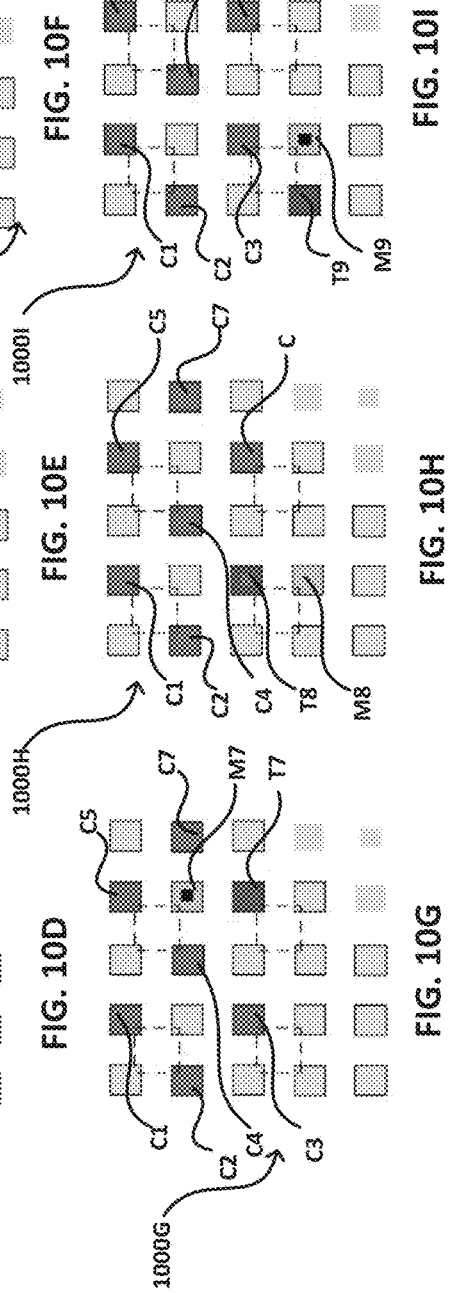

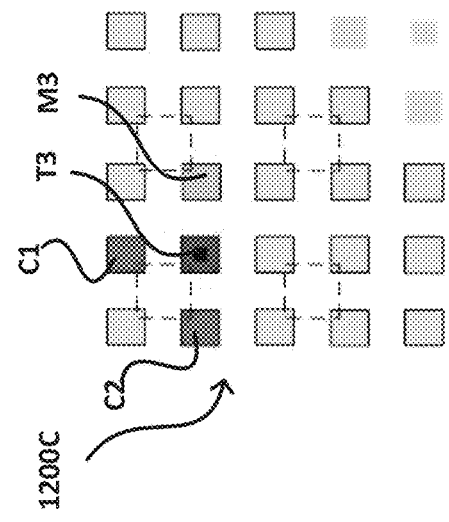
FIG. 12C
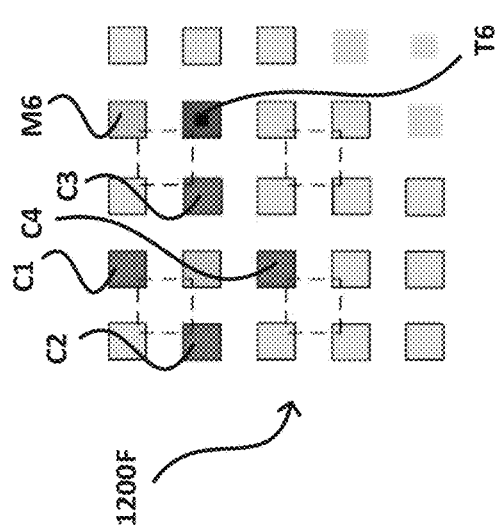
FIG. 12F
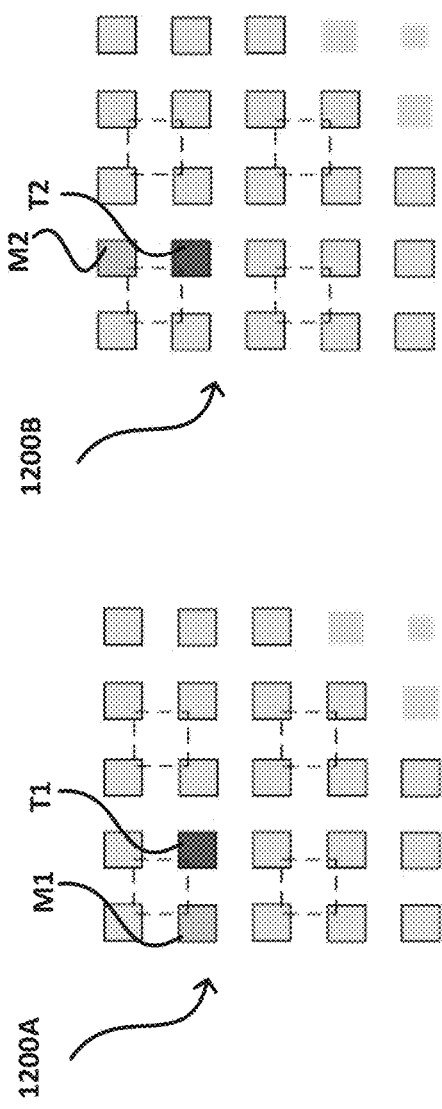
FIG. 12B
FIG. 12A
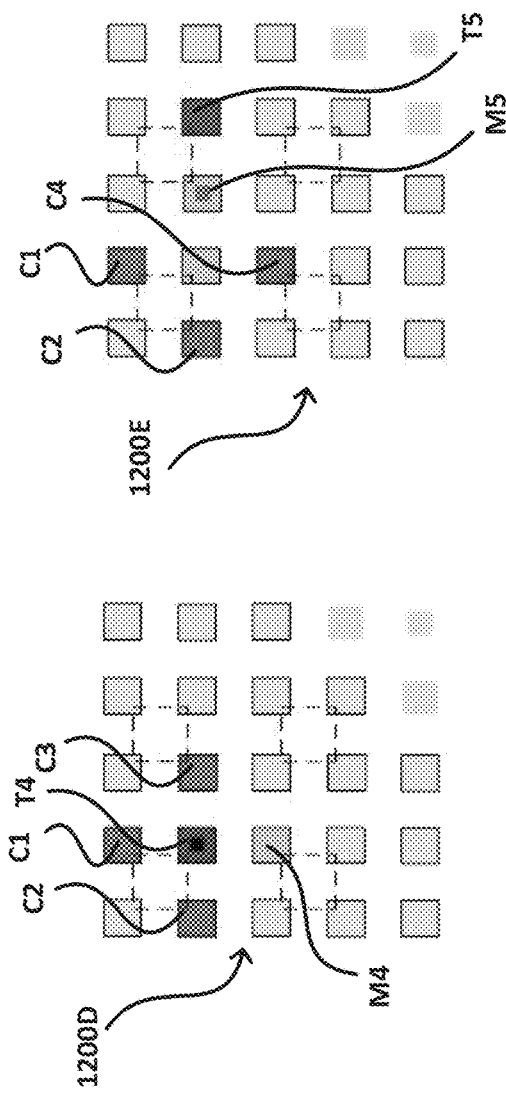
FIG. 12E
FIG. 12D

CALIBRATION OF ACTIVE PHASED ARRAY SYSTEM USING BEAMFORMING RFIC BUILT-IN-TEST EQUIPMENT

This application claims the benefit of U.S. Provisional Application No. 62/941,065, filed on Nov. 27, 2019, which application is hereby incorporated herein by reference.

TECHNICAL FIELD

The present invention relates generally to a system and method calibration of an active phased array system using beamforming built-in-test equipment (BITE), and, in particular embodiments, to a system and method for.

BACKGROUND

Phased array antennas are used for antenna beam pattern forming (beamforming) in radar and communication systems. The beamforming is achieved by applying phase and amplitude weights to transmission lines feeding the phased array antenna elements. For optimum performance of the radar system using the phased array antenna, the phase and amplitude weights should be calibrated to compensate for phase and amplitude mismatches in the lines feeding the phased array antenna elements.

SUMMARY

According to an embodiment, a transmit chain calibration method of a phased array system comprises injecting a tone into a first antenna element of an antenna array of the phased array system; receiving the tone by a second antenna element of the antenna array of the phased array system through parasitic coupling between the first antenna element and the second antenna element; measuring a first phase difference between the tone injected into the first antenna element and the tone received by the second antenna element; injecting the tone into a third antenna element of the antenna array of the phased array system; receiving the tone by the second antenna element of the antenna array of the phased array system through parasitic coupling between the third antenna element and the second antenna element; and measuring a second phase difference between the tone injected into the third antenna element and the tone received by the second antenna element.

According to another embodiment, a receive chain calibration method of a phased array system comprises injecting a tone into a first antenna element of an antenna array of the phased array system; receiving the tone by a second antenna element of the antenna array of the phased array system through parasitic coupling between the first antenna element and the second antenna element; measuring a first phase difference between the tone injected into the first antenna element and the tone received by the second antenna element; receiving the tone by a third antenna element of the antenna array of the phased array system through parasitic coupling between the first antenna element and the third antenna element; and measuring a second phase difference between the tone injected into the first antenna element and the tone received by the third antenna element.

According to another embodiment, a calibration method for a phased array system, the method comprises sequentially injecting a tone into a first plurality of antenna elements of an antenna array; receiving the tone by a second plurality of antenna elements of the antenna array through parasitic coupling between the first plurality of antenna elements and the second plurality of antenna elements; measuring a plurality of phase errors between the first plurality of antenna elements and the second plurality of antenna elements; populating a lookup table with the plurality of phase errors; and calibrating a plurality of phase shifters associated with a plurality of channels in the phased array system using the plurality of phase errors in the lookup table.

BRIEF DESCRIPTION OF THE DRAWINGS

For a more complete understanding of the present invention, and the advantages thereof, reference is now made to the following descriptions taken in conjunction with the accompanying drawings, in which:

FIGS. 10A through 10K are sequential plan views of the antenna array during the transmit chain calibration method of FIG. 9;

FIGS. 12A through 12H are sequential plan views of the antenna array during the receive chain calibration method of FIG. 11;

DETAILED DESCRIPTION OF ILLUSTRATIVE EMBODIMENTS

According to embodiments, a calibration method for a phased array system uses the combination of BITE elements of beamforming RF integrated circuits (RFICs), which include phase-locked loops (PLLs), injectors, and phase/amplitude detection, parasitic coupling between orthogonal antenna elements in a phased array antenna coupled to the beamforming RFICs, and digital frontend capability to generate test signals and measure the corresponding phase and amplitude at various points within the phased array system. According to embodiments, the above components and properties of the phased array system are combined to perform calibration of the complete phased array system (including all of the system components from the digital frontends to the antennas) in both receive and transmit modes.

Figure 1:
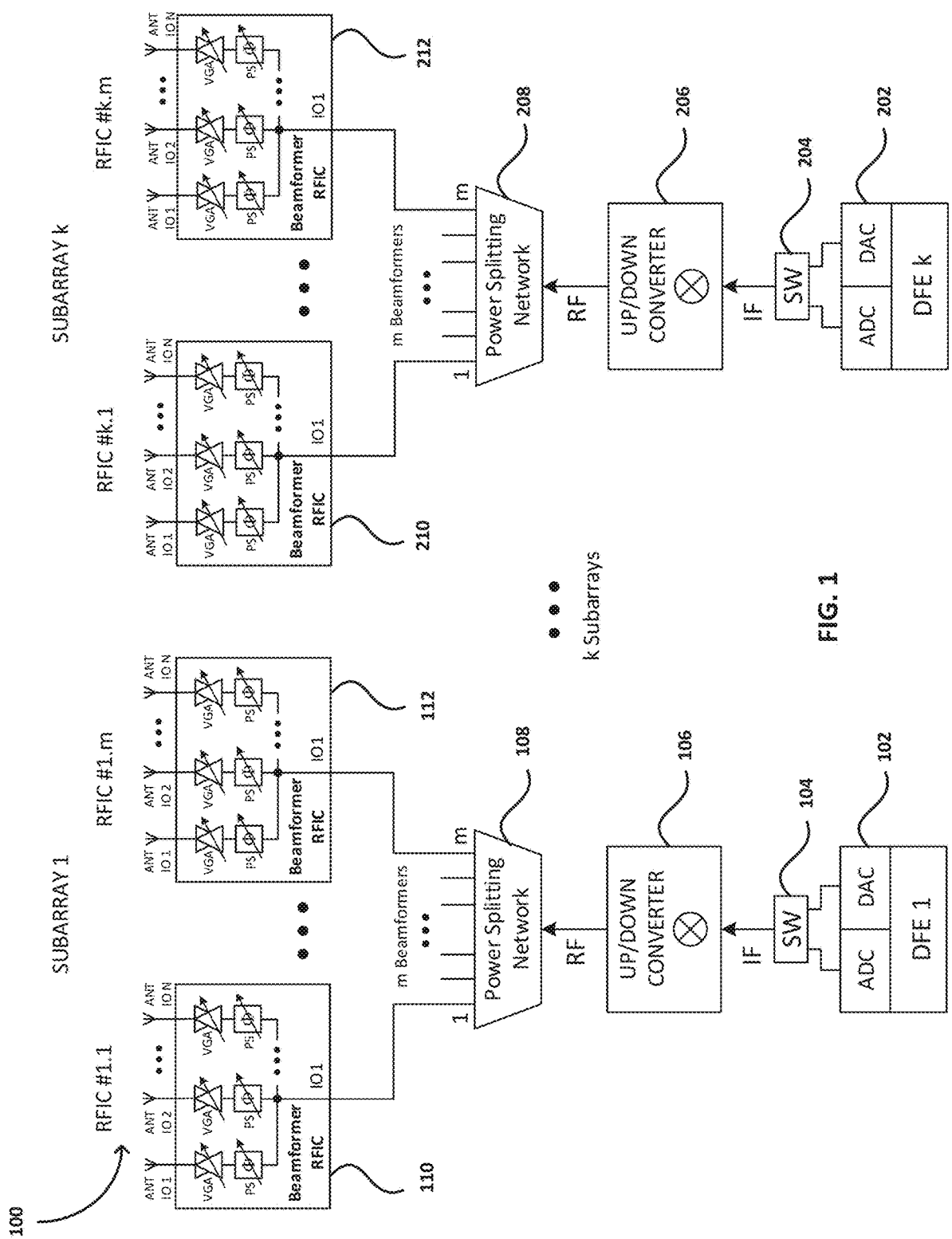
FIG. 1 is a block diagram of an exemplary beamforming phased array system.

FIG. 1 is a block diagram of an exemplary beamforming phased array system 100. For ease of understanding, some of the BITE circuitry associated with the beamformer RFICs has been omitted. Phased array system 100 includes a plurality antenna subarrays arranged from subarray 1 to subarray k. Each subarray comprises a plurality of antenna elements 1 through N coupled to input/output lines $IO_1$ through $IO_N$, wherein "N" can represent, for example, a row or column of antenna elements. Each row or column is repeated "M" times in each subarray. A plurality of beamformer RFICs 110 (RFIC #1.1) through 112 (RFIC #1.m) are used to service each subarray in both receive and transmit modes. Intermediate subarrays, now shown, are coupled to a plurality of intermediate beamformer RFICs. A final subarray k is coupled to beamformer RFICs 210 through 212.

Each beamformer RFIC 110, 112, 210, 212 comprises a plurality of bidirectional variable gain amplifiers (VGA) and a plurality of phase shifters (PS). The variable gain amplifiers VGA and phase shifters PS can be weighted to adjust for gain variations and phase variations caused by mismatches between components and signal paths in the individual channels in the phased array system 100. Beamformer RFICs 110 through 112 are coupled to a bidirectional power splitting network 108, and beamformer RFICs 210 through 212 are coupled to a power splitting network 208. In turn power splitting network 108 is coupled to an up/down converter 106, and power splitting network 208 is coupled to an up/down converter 206, for converting between RF signals and intermediate frequency (IF) signals. Up/down converter 106 is coupled to a switch 104, and up/down converter 206 is coupled to switch 204. Switch 104 is coupled to digital frontend 102, and switch 204 is coupled to digital frontend 202. Digital frontends 102 and 202 include and analog-to-digital converter (ADC), a digital-to-analog converter (DAC), as well as local oscillator (LO) circuitry such as a sine wave oscillator.

The phase and gain weights can be applied by using variable gain amplifiers or attenuators and phase shifters as shown in FIG. 1, or in RF, IF or LO sections of the antenna array feeding lines in the analog domain. Alternatively, the weights can be applied in the digital domain before digital to analog (DA) and analog to digital (AD) conversion in RF, IF or base band (BB) sections of the system. The digital beamforming is preferred in some embodiments due to a simplified RF frontend of the system. One aspect of digital beamforming is a relatively higher cost and high power consumption in DA and AD conversion and in digital processing of high bandwidth signals with respect to analog beamforming. For high bandwidth signals, analog beamforming or hybrid beamforming (combination of analogue and digital beamforming) can be used.

FIG. 1 thus shows a functional block diagram of a beamforming system using analog beamforming. In order to implement control of phases and amplitudes on multiple individual antenna elements of its phased array, integrated transmit/receive beamformer RFICs 110, 112, 210, and 212, which include several variable amplifiers VGA (or attenuators) and phase shifters PS are used to feed antenna elements 1 through N in each of M subarrays. The number of integrated channels N of a beamformer RFIC 110, 112, 210, and 212 depends on integrated circuit space and power consumption constraints. The up/down converter 106, 206, which can also comprise an RFIC, performs frequency conversion from/to low frequency IF to/from high frequency RF domains. To enable multiple-input, multiple-output (MIMO) operation such phased array systems 100 as shown in FIG. 1 are often divided into k sub-array groups with independent digital frontends (DFE) 102 and 202. Each subarray includes a number "M" of beamformer RFICs 110, 112, 210, and 212, and spatially can be organized in arbitrary antenna element groups.

Figure 2:
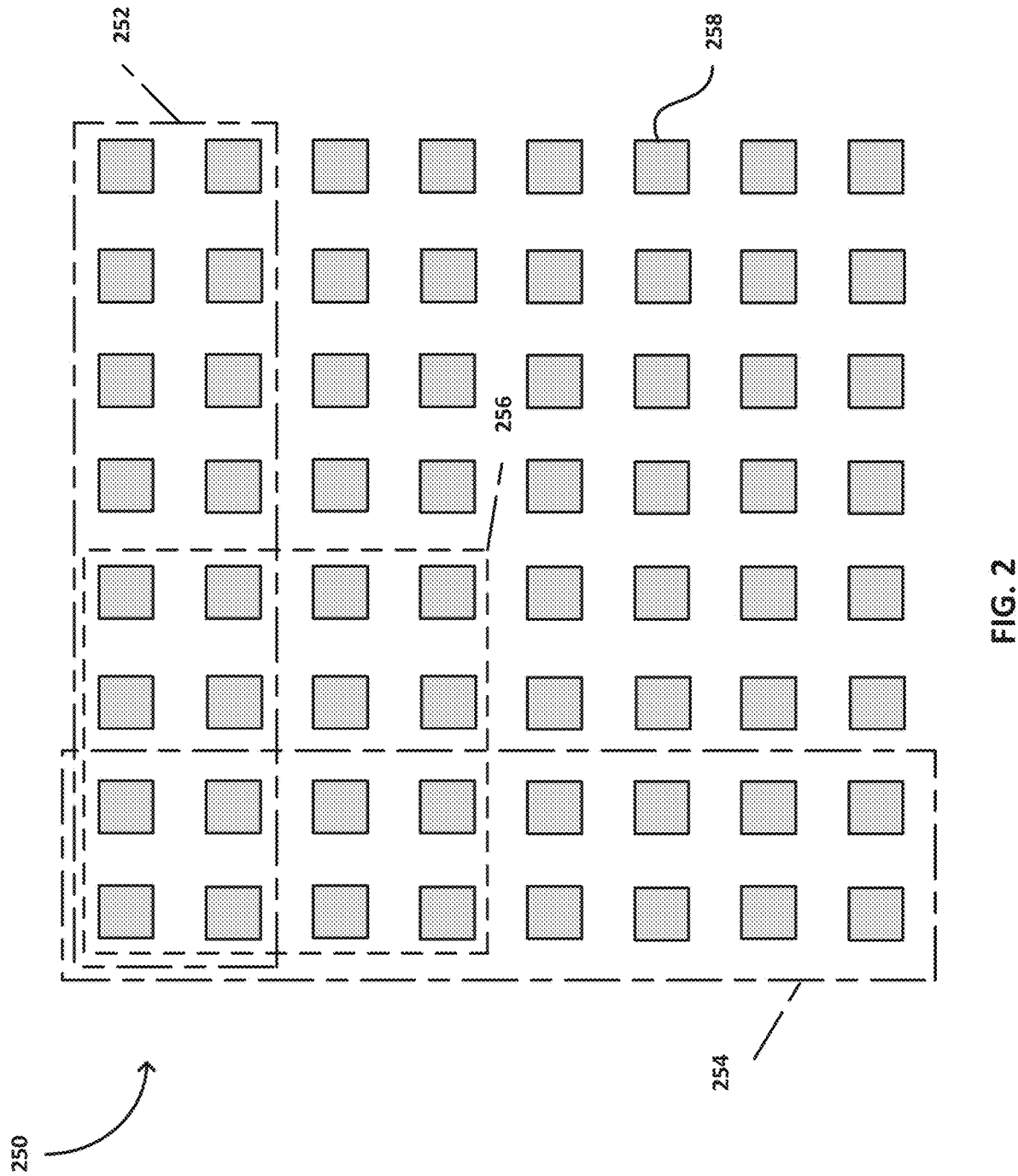
FIG. 2 is a plan view of an antenna array comprising a plurality of subarray configurations of individual antenna elements.

FIG. 2 is a plan view of an antenna array 250 for use in the phased array system 100 of FIG. 1 comprising a plurality of subarray configurations of individual antenna elements 258. For example, FIG. 2 shows several possible subarray configurations, including rectangular and square subarrays. Subarray 252 comprises a rectangular subarray including the first two rows of antenna elements in antenna array 250. Subarray 254 comprises a rectangular subarray including the first two columns of antenna elements in antenna array 250. Subarray 256 comprises a four by four square array of antenna elements in the upper left corner of antenna array 250. Other subarray configurations are possible that can be used singly or in combination for providing different beamforming configurations that in turn comprise differently shaped and directed radar beams as is described in further detail below.

The accuracy of the phased array antenna beamforming depends on the accuracy of the phase and amplitude weights and on initial phase and amplitude errors in the building blocks of the array. Therefore the array phase and amplitude errors caused by mismatches in the various components of the phased array system 100 shown in FIG. 1 including RFICs, power splitters, and other components, as well as parasitic capacitances in a corresponding printed circuit board (PCB) used to build the phased array system, and other mismatches and imperfections need to be initially calibrated out before applying the phase and gain weights needed for beamforming. In addition to an initial calibration a recalibration of the phased array is ideally performed on a repetitive basis to calibrate out the errors due to environmental factors and aging of the phased array system 100. Only relative differences in phase and amplitude among different array elements are of interest for array calibration.

Figure 3:
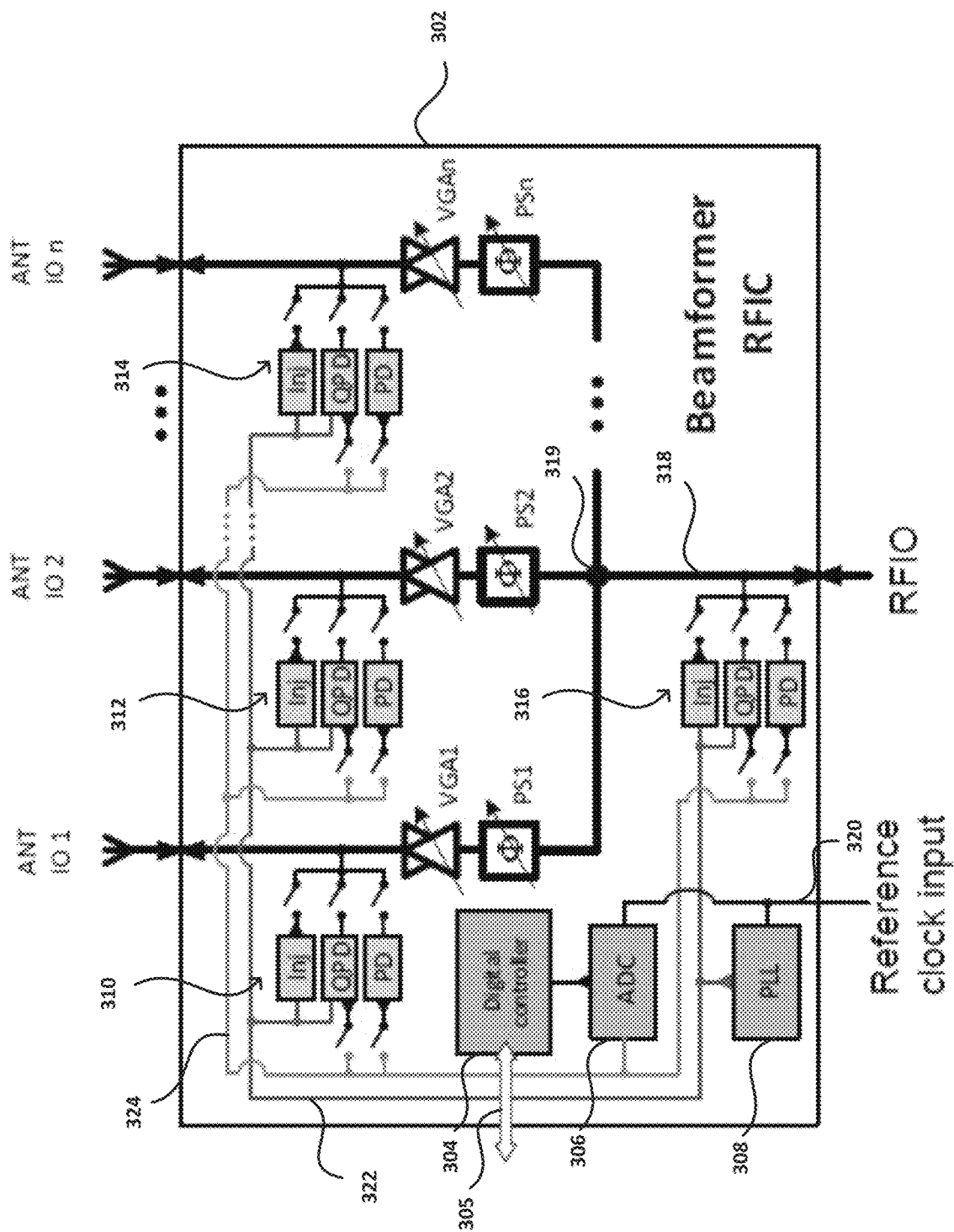
FIG. 3 is a block diagram of a beamformer integrated circuit for use in a beamforming phased array system, according to an embodiment.

FIG. 3 is a block diagram of a beamformer RF integrated circuit 302 for use in the beamforming phased array system 100, according to embodiments. Beamformer RFIC 302 includes a digital controller 304 for configuring the operational state of on-chip BITE components and for communicating with a system controller (not shown in FIG. 3) through digital bus 305. Digital controller 304 is coupled to an ADC. ADC receives a reference clock at reference clock input 320, also from the system controller or system clock generator. The output of ADC 306 is coupled to various other on-chip components through an analog bus 324. Beamformer RFIC 302 also includes a phase-locked loop (PLL) 308, which also receives the reference clock at the reference clock input 320. The output of PLL 308 is coupled to various other on-chip components through a digital bus 322. As previously shown in FIG. 1, beamformer RFIC 302 includes a plurality of bidirectional variable gain amplifiers VGA1, VGA2, though VGAn and a plurality of phase shifters PS1, PS2, and PSn for coupling the RF signals on RFIO bus 318 to and from a subarray of antenna elements of the phased array antenna through I/O ports IO1, IO2, through IOn.

In addition, beamformer RFIC 302 also includes a number of BITE circuit components arranged in groups. A first group 310 of BITE circuit components comprises an injector (Inj) selectively coupled between the IO1 port and the digital bus 322, a quadrature phase detector (QPD) selectively coupled between the IO1 port and the analog bus 324, and a power detector (PD) selectively coupled between the IO2 port and the analog bus 324. A second group 312 of BITE circuit components is selectively coupled to the IO2 port, a third group 314 of BITE circuit components is selectively coupled to the IOn port, and a fourth group 316 of BITE circuit components is selectively coupled to the RFIO bus 318.

The beamformer RFIC 302 and the on-chip components are described below in further detail.

Beamformer RFIC 302 is a bidirectional multichannel TX/RX RF frontend IC, which applies unique weights (gain and phase shifts) to all of its individual channels, each of which feeds individual antenna elements combined into a single phased array or subarray. The unique weights enable analog beamforming control of phased array radios, when weights are applied to analog signals in the RF frequency domain (the frequency domain at which transmission takes place).

In the transmit (TX) mode, RF signal travels from the RFIO port 318, and its power is equally split between all the channels of the RFIC by means of passive power splitter/combiner (represented by junction node 319). Every channel is equipped with its own gain control block (VGA) and a phase shifter (PS). Once the phase shifters (PS) and variable gain amplifiers (VGA) have the desired weights applied, the RF output signals travel to the plurality of antenna elements in the array or subarray and are radiated in the direction (beam) corresponding to the desired weights applied.

In the receive (RX) mode, RF signals received at each antenna element travel through individual VGA and PS components towards the combiner 319. After going through individual VGA and PS components weights are applied to the signals, and thus in a following combiner 319 only the signals coming from the desired direction (beam) are added up in phase and travel further down to the RFIO output 318.

BITE blocks are used for production testing and calibration purposes.

PLL 308 is a phase locked loop, and generates a continuous wave (CW) tone, such as a sine wave tone, in the RFIC operational frequency range, locked to a reference CW tone at the RFIC input. This tone can then be injected at RFIC ports to travel along it channels to be measured at other ports. This is achieved in conjunction with following blocks described below.

QPD in BITE groups 310, 312, 314, and 316 is a quadrature phase detector comprising an IQ mixer used to measure the phase difference between two CW tones of the same frequency at its inputs. A first tone signal is received from the digital PLL bus 322. The other tone signal can be a PLL tone injected elsewhere in the RFIC 302 and travelled through a corresponding signal path, or another CW tone coming from outside the RFIC but locked to the same frequency as the on-chip PLL 308 (and from the same reference clock), i.e. the another CW tone should ideally be a phase coherent tone.

PD in BITE groups 310, 312, 314, and 316 is a power detector, and is used to measure RF signal power.

Inj in BITE groups 310, 312, 314, and 216 is a signal injector, and is used to inject the PLL tone at various RFIC ports.

ADC 306 is an analog to digital converter, and performs a measurement of a DC voltage on the analog bus 324. The result is written to corresponding register of the RFIC digital section in digital controller 304, from where it is then read by a system digital controller not shown in FIG. 3 over digital bus 305.

Digital controller 304 performs the configuration of all the internal chip blocks (switches, VGA gain settings, PS settings, PLL settings, internal SRAM settings, internal register maps, as well as other settings).

Figure 4:
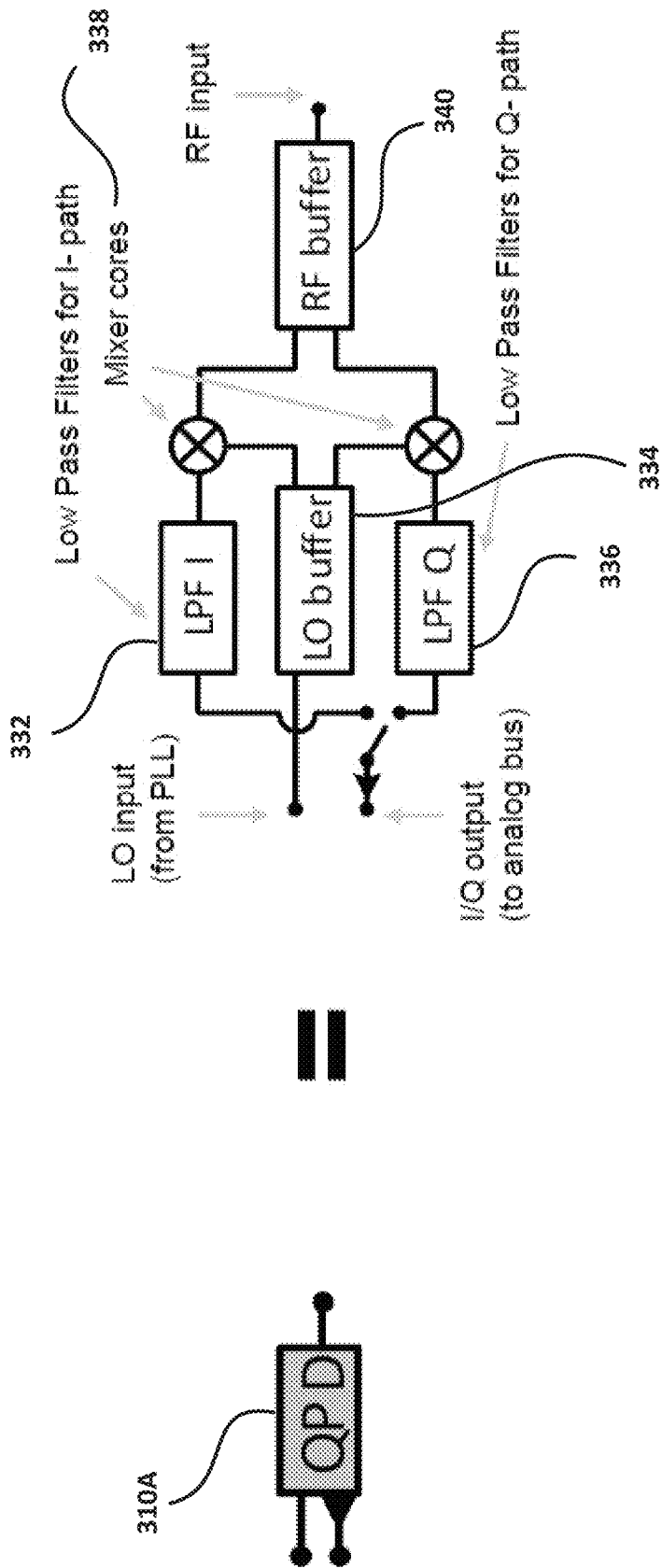
FIG. 4 is a schematic diagram of a quadrature phase detector (QPD) of the beamformer integrated circuit shown in FIG. 3.

FIG. 4 is a schematic diagram of a quadrature phase detector (QPD) 310A of the beamformer integrated circuit 302 shown in FIG. 3. In an embodiment, QPD 310A comprises an IQ-mixer with switched I- and Q-outputs. QPD 310A comprises a low pass filter 332, a buffer 334, another low pass filter 336, a pair of mixer cores 338, and another buffer 340. Buffer 340 is an RF buffer having an input coupled to the RF input. The dual outputs of buffer 340 are coupled to mixer cores 338. The input of low pass filter 332 for the I-path is coupled to a first of mixer cores 338 and the output of low pass filter 332 is selectively coupled to the analog bus 324. The input of low pass filter 336 for the Q-path is coupled to a second of mixer cores 338 and the output of low pass filter 336 is selectively coupled to the analog bus 324. The input of LO buffer 334 is coupled to PLL 308 via the digital bus 332.

Figure 5:
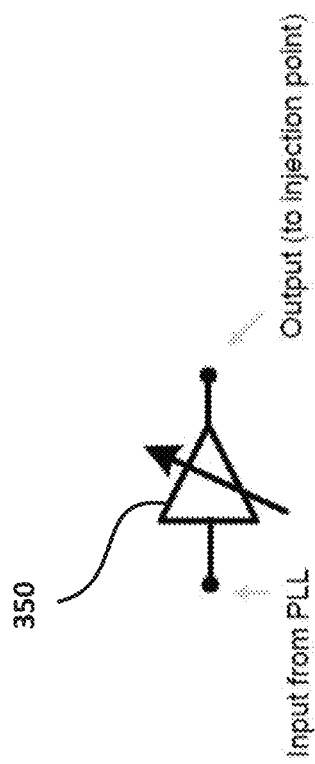
FIG. 5 is a schematic diagram of an injector (Inj) of the beamformer integrated circuit shown in FIG. 3.

FIG. 5 is a schematic diagram of an injector (Inj) of the beamformer integrated circuit shown in FIG. 3. Injector 310B comprises a buffer amplifier 350 for the PLL signal with a controlled gain to ensure an adequate level of the PLL tone at the injection point.

Figure 6:
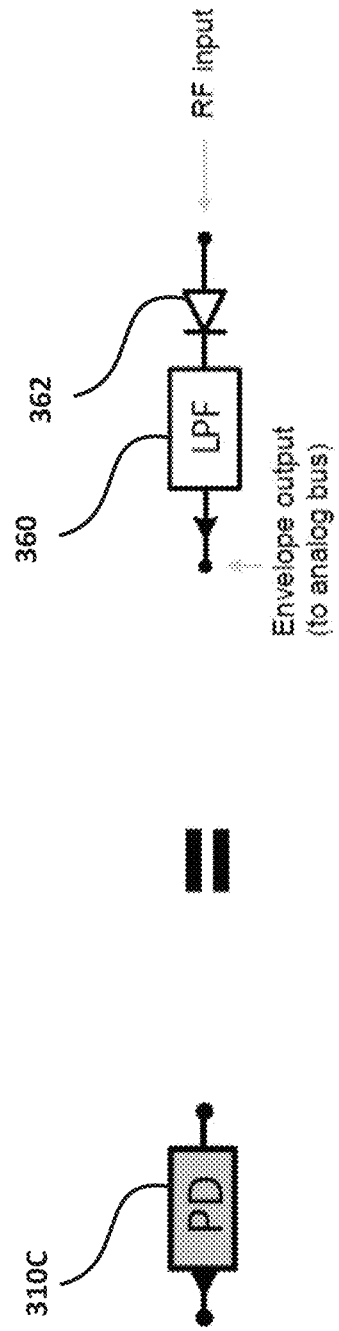
FIG. 6 is a schematic diagram of a power detector (PD) of the beamformer integrated circuit shown in FIG. 3.

FIG. 6 is a schematic diagram of a power detector (PD) of the beamformer integrated circuit shown in FIG. 3. Power detector 310C is an envelope tracking diode based detector comprising a low pass filter 360 having an output coupled to the analog bus 324 coupled to a diode 362 having an anode coupled to the RF input.

Figure 7:
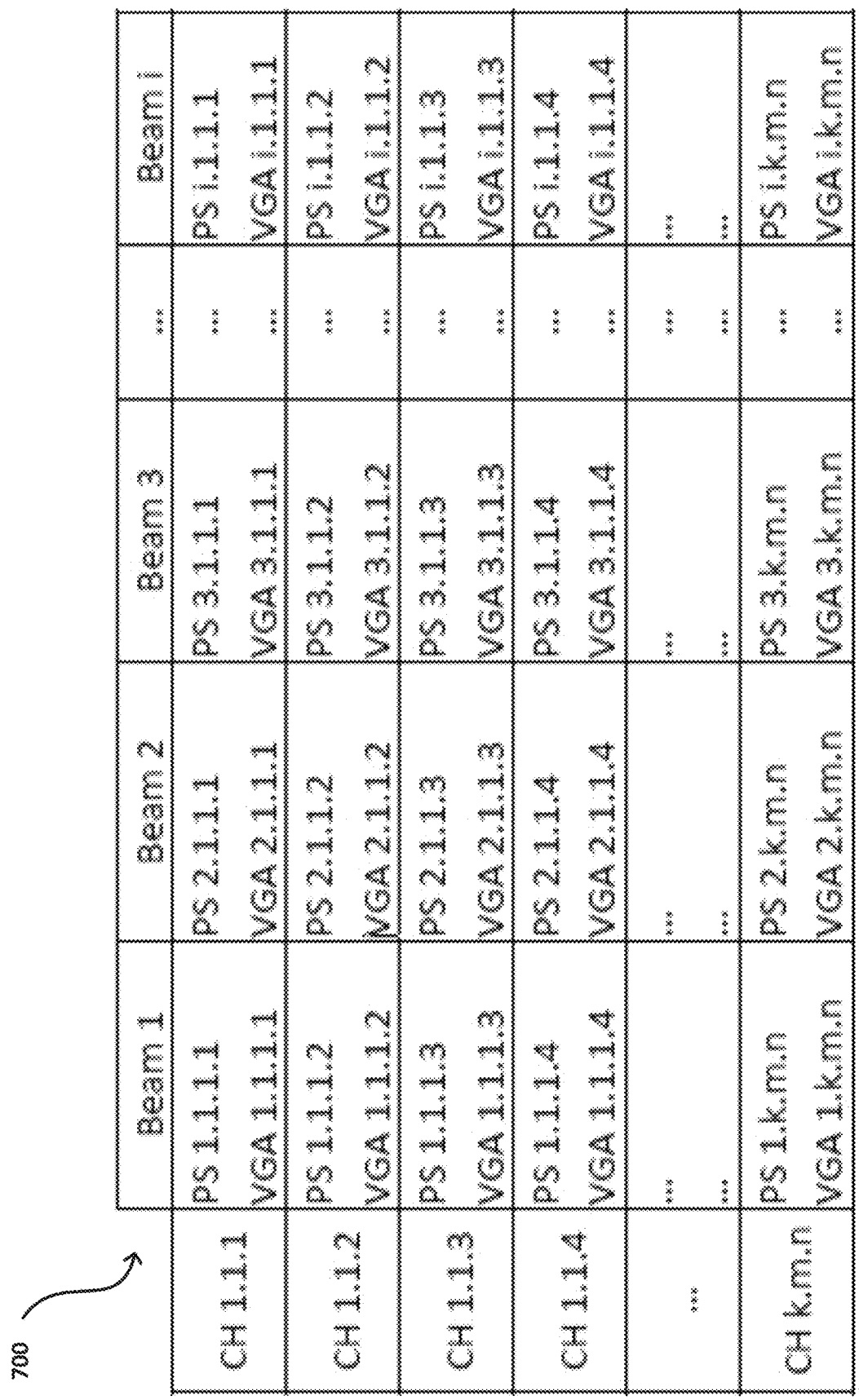
FIG. 7 is a table of a lookup table of the beamforming phased array stem showing phase and gain entries for a plurality of channels for a plurality of beam configurations, according to an embodiment.

FIG. 7 is a table of a lookup table 700 of the beamforming phased array stem showing phase and gain entries for a plurality of channels for a plurality of beam configurations, according to an embodiment. The channels are labeled channel CH 1.1.1, channel CH 1.1.2, channel CH 1.1.3, channel CH 1.1.4 through channel k.m.n, and the corresponding beams are labeled Beam 1, Beam 2, Beam 3, through Beam i. The corresponding entries contain phase (PS) and gain (VGA) entries. The entries include the phase and gain weights for constructing the corresponding beams. The lookup table 700 is described in further detail below.

Figure 8:
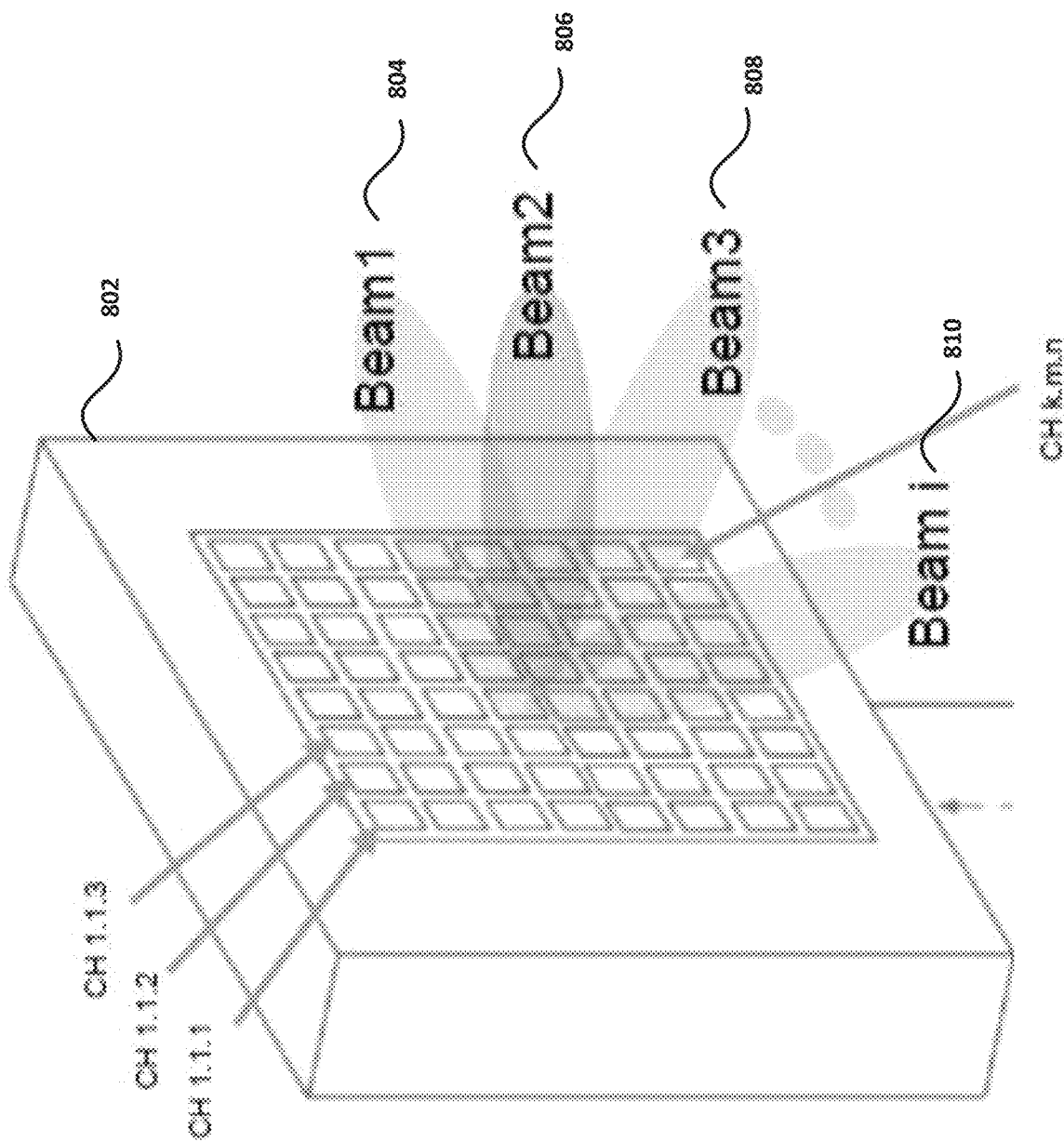
FIG. 8 is a diagram of an antenna array having different beam configurations corresponding to the phase and gain entries of the lookup table of FIG. 7.

FIG. 8 is a diagram of an antenna array 802 having different beam configurations Beam 1 804, Beam 2 806, Beam 3 808, through Beam i 810 corresponding to the phase and gain entries of the lookup table 700 of FIG. 7. Antenna array also shows the corresponding channels CH 1.1.1, CH 1.1.2, CH 1.1.3, through channel CH k.m.n. The beamforming displayed in FIG. 8 is also described in further detail below.

At every stage of the signal path of the phased array system 100 shown in FIG. 1, phase and amplitude errors are collected thus leading to significant initial differences between signals at antenna ports for the TX mode, or at the ADC inputs for the RX mode. According to embodiments, these phase and amplitude errors are compensated in a calibration method by adjusting the analog beam weights of the beamformer RFICs stored in lookup table 700 shown in FIG. 7. This calibration method is defined herein as beamforming codebook correction.

The beamforming codebook is a set of the beam weights for all of the channels, and all of the beams that will be used by the radio. The beamforming codebook is stored as a lookup table 700 (LUT), usually resident in the system digital controller (shown in FIGS. 9 and 11).

Aspects of the beamforming codebook (LUT) are described in further detail below. The beam is a direction in which most of the energy is corresponding radiated or received in TX/RX mode. The channel (CH) is particular signal path channel feeding a single antenna element in the antenna array 802 shown in FIG. 8. PS i.k.m.n is the setting for the phase shifter for i-th beam, for k-th subarray, for m-th beamformer, for n-th channel as shown in the lookup table 700 of FIG. 7. VGA i.k.m.n is the setting for variable gain amplifier VGA for i-th beam, for k-th subarray, for m-th beamformer, for n-th channel as shown in the lookup table 700 of FIG. 7.

In FIG. 7, the phase and gain entries in the lookup table comprise entries for the phased array system configured in the TX mode, in an embodiment. A separate lookup table may be used for the same phased array system configured in the RX mode, since the RX will be separated calibrated as is explained in further detail below. The RX mode lookup table will also be resident in the system controller, in an embodiment.

Figure 9:
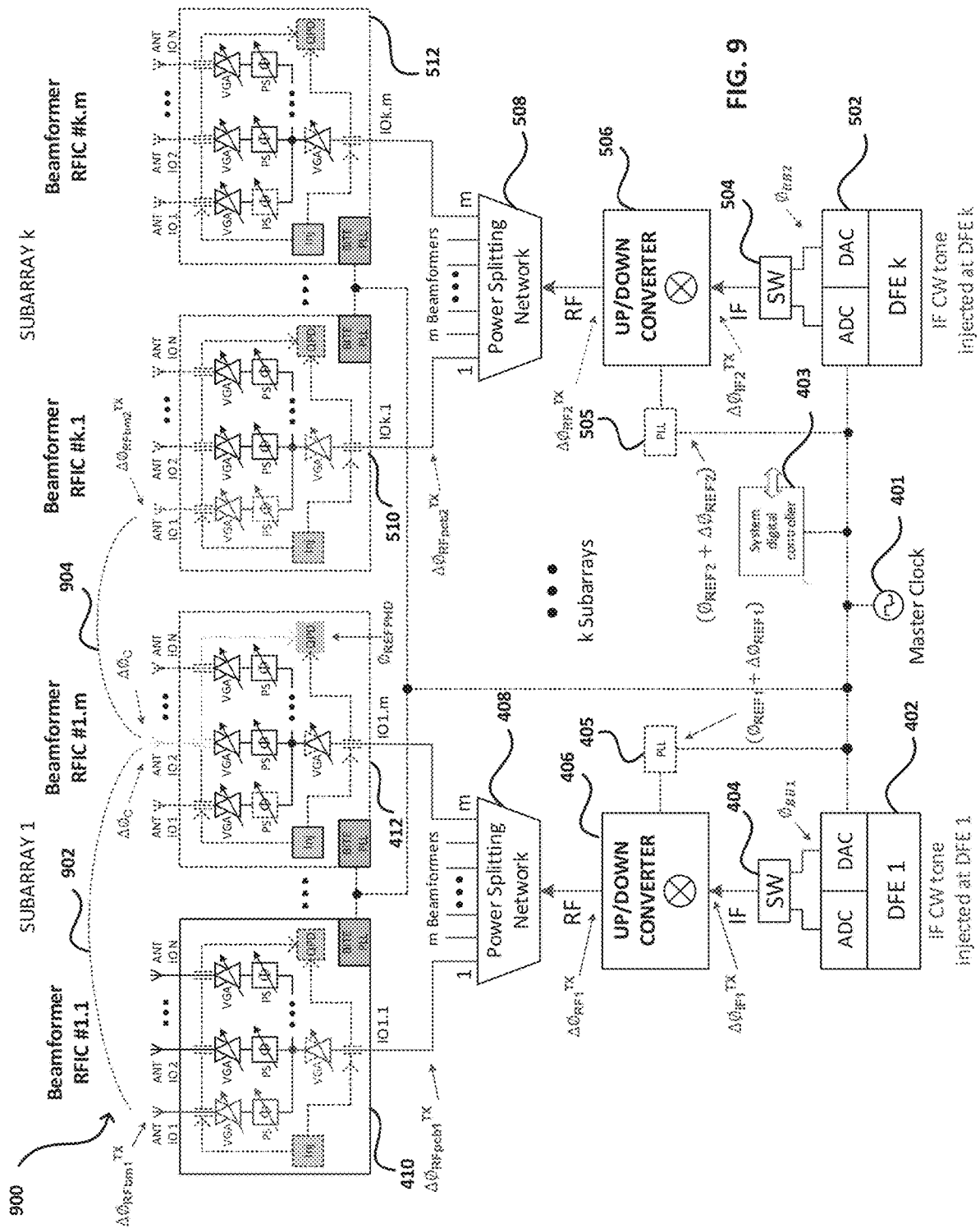
FIG. 9 is a diagram of a beamforming phased array system configured for a transmit mode calibration method, according to an embodiment.

FIG. 9 is a diagram of a beamforming phased array system 900 configured for a transmit mode calibration method, according to an embodiment. The phased array system components for beamforming phased array system 900 are substantially the same as those shown for beamforming phased array system 100, and include a first set of components for servicing the first subarray SUBARRAY 1, including a digital frontend 402, a switch 404, a PLL 405, an up/down converter 406, a power splitting network 408, and a plurality of beamformer RFICs 410 through 412 including the BITE components previously described including the injector Inj, quadrature phase detector QPD, and BITE PLL. Phased array system 900 also includes a last set of components for servicing the last subarray SUBARRAY k, including a digital frontend 502, a switch 504, a PLL 505, an up/down converter 506, a power splitting network 508, and a plurality of beamformer RFICs 510 through 512 including the BITE components previously described including the injector Inj, quadrature phase detector QPD, and BITE PLL.

Phase array system 900 also includes a master clock 401 coupled to digital frontends 402 and 502, PLLs 405 and 505, as well as beamformer RFICs 410, 412, 510, and 512. Master clock 401 can be provided by a system digital controller 403, which can communicate with one or more system components through a digital bus. Also shown in FIG. 9 are parasitic couplings 902 and 904 between antenna elements. Parasitic coupling 902 is between antenna element ANT IO1 coupled to beamformer RFIC 410 and antenna element ANT IO2 of beamformer RFIC 412. Parasitic coupling 904 is between antenna element ANT IO1 coupled to beamformer RFIC 510 and antenna element ANT IO2 of beamformer RFIC 412. The parasitic coupling provides the transfer of the phase shift information sequentially between antenna elements, such that the necessary phase correction information can be determined and stored in a lookup table, until the entire phased array system 900 is calibrated. The calibration method is described in detail below.

According to embodiments, the calibration method extends beamforming RFIC standalone calibration functionality to a system level, is applicable to arbitrary subarray configurations and does not require phased array channels to operate in TX and RX modes simultaneously. According to embodiments, the calibration method makes use of inherent parasitic couplings between adjacent array antenna elements in combination with the RFIC BITE functionality. According to embodiments, the calibration method allows calibrate of phases and amplitudes across all of arbitrarily configured phased array antenna channels eliminating the need to use complex over-the-air (OTA) calibration in production.

The example shown in FIG. 9 is a phased array system 900 composed of k subarrays, each having an independent digital frontend (DFE) 402 through 502 and Up/Down Converter RFIC (UD) 406 through 506, k*m Beamforming RFICs (m per subarray) 410, 412, through 510, 512, and k*m*N channels in total (N channels per Beamformer RFIC).

Concentrating on signal phases along the TX path of the system, the phase of the transmitted signal is defined by the following contributions:

$\Phi_{BBj}$=baseband IF phase, $1 \leq j \leq k$;

$\Delta\Phi_{IFj}$=IF phase shift from baseband to UD converter IF port, $1 \leq j \leq k$;

$\Delta\Phi_{REFj}$=Reference clock phase shift up UD PLL reference port, $1 \leq j \leq k$;

$\Delta\Phi_{RFj}$=RF phase shift from UD converter RF port to a PCB splitter, $1 \leq j \leq k$;

$\Delta\Phi_{RFpbj,l}$=RF phase shift from PCB splitter to Beamformer RFIC IO port, $1 \leq j \leq k$, $1 \leq l \leq m$; and $\Delta\Phi_{RFbmj,l,i}$=RF phase shift from Beamformer RFIC IO port to considered antenna port, $1 \leq j \leq k$, $1 \leq l \leq m$, $1 \leq i \leq N$.

System is calibrated when $\Phi_{ANT}$ (see equation below for Tx case) is the same for all antenna ports, i.e. signals at all antenna ports will have the same phase.

$$\Phi_{ANT} = \Phi_{BBj} + \Delta\Phi_{IFj}^{Tx} + NPLL(\Phi_{REF} + \Delta\Phi_{REFj}) + \Delta\Phi_{RFj}^{Tx} + \Delta\Phi_{RFpcbj,l}^{Tx} + \Delta\Phi_{RFbmj,l,i}^{Tx}$$

To achieve this, an embodiment calibration method is applied to phased array system 900 of FIG. 9.

Step 1. The entire phased array system 900 is configured to operate in TX mode.

Step 2. A CW tone at the same frequency of calibration is injected sequentially at DFE1 402 through DFEk 502 (one at a time).

Step 3. The injected tone travels through the complete TX chain up to one of the antenna elements, which is enabled for transmit (ANT IO1 of Beamformer RFIC1.1 410 of Subarray 1, only this single antenna element is enabled, all others are disabled or their feeding channels are set to maximum attenuation). Power of the transmitted tone is in the linear region of operation of output PA.

Step 4. By means of parasitic coupling between antenna elements, the transmitted CW tone is received at antenna port ANT IO2 of Beamformer RFIC1.m 412.

Step 5. Beamformer RFIC1.m 412 is configured in such a way that all of its channels are disabled or set to maximum attenuation and the Quadrature Phase Detector (QPD) is connected to antenna port ANT IO2.

Step 6. The phase and amplitude of the received CW tone at ANT IO2 port of Beamformer RFIC1.m 412 is measured using the on-chip QPD.

Step 7. Channel feeding ANT IO1 of Beamformer RFIC1.1 410 of Subarray 1 is disabled and channel feeding ANT IO1 of Beamformer RFICk.1 510 of Subarray 1k is enabled.

Step 8. The phase and amplitude of the received CW tone at ANT IO2 port of Beamformer RFIC1.m 412 is measured using the on-chip QPD. It is noted that in step 8 the CW tone is transmitted through a different path.

Step 9. Two phase and amplitude measurements provide differences between the measurements at steps 6 and 8, and these measurements are the offsets to be calibrated. Phase measurements are defined by the following two equations:

$$\emptyset_{PHDET1} = \emptyset_{BB1} + \Delta\emptyset_{IF1}^{TX} + NP_{LL}(\emptyset_{REF1} + \Delta\emptyset_{REF1}) + \Delta\emptyset_{RF1}^{TX} + \Delta\emptyset_{RFpcb1}^{TX} + \Delta\emptyset_{RFbm1}^{TX} + \Delta\emptyset_C - \emptyset_{REFPHD}$$

$$\emptyset_{PHDET2} = \emptyset_{BB2} + \Delta\emptyset_{IF2}^{TX} + NP_{LL}(\emptyset_{REF2} + \Delta\emptyset_{REF2}) + \Delta\emptyset_{RF2}^{TX} + \Delta\emptyset_{RFpcb2}^{TX} + \Delta\emptyset_{RFbm2}^{TX} + \Delta\emptyset_C - \emptyset_{REFPHD}$$

where $\emptyset_{PHDET1}$ is the total accumulated phase shift in the transmit path of antenna ANT IO1 associated with beamformer RFIC 410, and wherein ØPHDET2 is the total accumulated phase shift in the transmit path of antenna ANT IO1 associated with beamformer RFIC 510. All of the other phase shift terms in the above two equations were previously defined except for two additional phase shift components. The additional phase shift components in the two above equation are: $\Delta\emptyset_C$ is a phase shift introduced by parasitic antenna coupling between elements, which is known from antenna design/measurement data or is equal; and $\emptyset_{REFPHD}$ is a phase shift of the QPD reference clock, which is equal due to the same QPD being used for both measurements.

Step 10. The difference in total accumulated phase shift between the two transmit channels ($\emptyset_{PHDET1} - \emptyset_{PHDET2}$) is a phase correction to be stored in a LUT of the system digital controller 403, in an embodiment, and applied to one of the measured channels.

Step 11. The two transmit channels are thus calibrated, and the sequence repeats until all of the system channels are calibrated. Information from one group of calibrated channels is transferred to an adjacent group of calibrated channels as is explained in further detail below.

FIGS. 10A through 10K are sequential plan views of the antenna array during multiple applications of the transmit mode calibration method of FIG. 9 as the phased array system is sequentially being calibrated multiple times across all channels associated with the antenna array.

FIG. 10A shows an example upper left corner portion 1000A of an antenna array including an array of five by five antenna elements at a first step in the sequential calibration method wherein no channels are yet calibrated. At the first step in the sequential calibration method the CW tone is transmitted through a channel to a corresponding antenna element marked T1 in FIG. 10A, and the CW tone is transmitted via parasitic capacitive coupling through the antenna array to an adjacent orthogonal antenna element. The adjacent orthogonal antenna element measures the phase of the transmitted CW tone with a QPD in an associated beamforming RFIC marked M1 in FIG. 10A.

FIG. 10B shows the same antenna portion, but is now designated 1000B to indicate that another step in the sequential calibration method is undertaken. In the step shown in FIG. 10B, two channels adjacent orthogonal channels can be calibrated according the calibration method previously described, marked C1 and C2. The CW tone can be transmitted on a new adjacent orthogonal channel marked T2 in FIG. 10B.

FIG. 10C shows the same antenna portion, but designated 1000C to indicate that another step in the sequential calibration method is undertaken. In the step shown in FIG. 10C another channel can be calibrated marked C3, and the CW tone can be transmitted on yet another channel marked T3. The CW tone can again be measured by the channel marked M3.

In FIG. 10D, antenna portion 1000D, phase information a first group of orthogonally calibrated channels is transferred to a second group of orthogonally calibrated channels by transmitting the CW tone in a channel that has been previously calibrated. For example, previously calibrated channel C3 shown in FIG. 10C can now transmit the CW tone in FIG. 10D and is labeled T4. The phase information contained in the T4 channel is transferred to a new adjacent orthogonal channel and is measured and labeled M4.

In FIG. 10E, antenna portion 1000E, another adjacent orthogonal channel is used to transmit the CW tone and is again measured at the channel labeled M5. Channel M5 thus becomes the "hub" for a new set of calibrated channels in the second group of orthogonally calibrated channels.

In FIG. 10F, antenna portion 1000F, channel C5 is calibrated and the CW tone is transmitted on channel T6.

In FIG. 10G, antenna portion 1000G, channel C7 is calibrated and the CW tone is transmitted on channel T7.

In FIG. 10H, antenna portion 1000H, the CW tone is transmitted on a previously calibrated channel and is labeled T8. The transmitted CW tone is measured by an adjacent orthogonal channel labeled M8.

In FIG. 10I, antenna portion 1000I, the CW tone is again transmitted on adjacent orthogonal channel T9 and is again measured and labeled M9. Channel M9 becomes yet another "hub" for another new set of calibrated channels in a third group of orthogonally calibrated channels.

Figure 10K:
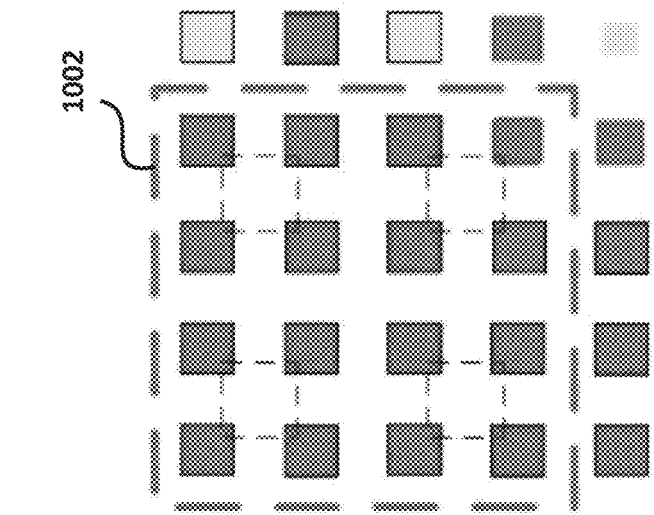
Figure 10J:
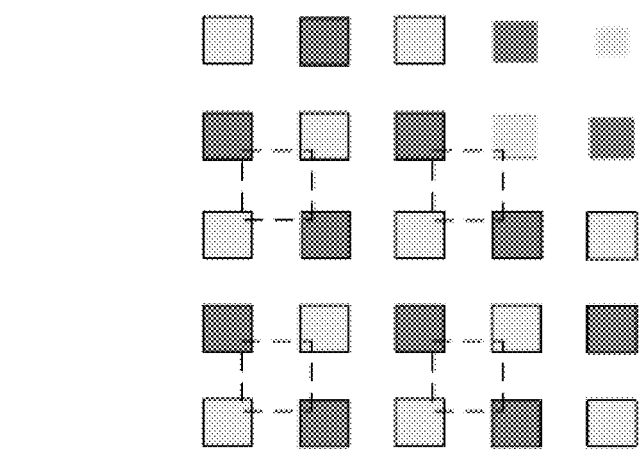

In FIG. 10J, antenna portion 1000J, all of the first half of channels in the phased array system are calibration to reveal a checkboard pattern of calibrated channels with adjacent orthogonal non-calibrated channels.

In FIG. 10K, antenna portion 1000K, the sequential calibration method is restarted at the upper left corner of the antenna array to "fill in" the uncalibrated channels such that a portion 1002 of the antenna array is completely calibrated. The sequential calibration method then continues until all uncalibrated channels in the phased array system are calibrated for each of the beams and the LUT is filled with all gain and phase entries for each beam. The phased array system is then calibrated in the transmit mode.

In addition to the above described steps, additional steps can be performed in the transmit mode. For example, power levels at each antenna port are measured using the PD in each of the beamformer RFICs. Only one channel is measure at a time and all other channels are disabled. The reference operational power level, also called a target level, is set to be the same for all channels and is selected to be a predetermined dB value above the weakest measured channel to ensure proper linear operating mode of the variable gain amplifiers (VGA) of the complete phased array system. However, if "tapering" is used for the beams, particular power levels for individual elements will be pursued to achieve the beam tapering.

Additionally, the sequence shown in FIGS. 10A through 10K is only one example of many such sequences that could be conducted to calibrate all of the channels in the phased array system. However, all such sequences may include an associated step sequence comprising sending the CW tone over a single antenna element; measuring the phase and level at another channel via parasitic antenna coupling between adjacent orthogonal antenna elements; repeating these two steps in sequence wherein several different channels are measured using the same transmit channel; and passing on calibrated values to the rest of the array using previously calibrated channels.

Adjacent orthogonal channels (and corresponding antenna elements) are desirably used in the calibration method, according to embodiments described herein since the parasitic coupling between these adjacent orthogonal channels (antenna elements) is the strongest relative to other antenna elements. Parasitic coupling between diagonal antenna elements can also be used in embodiments (instead of or in combination with adjacent orthogonally coupled antenna elements), resulting in various other antenna element to antenna element calibration sequences and geometrical calibration patterns not shown in FIGS. 10A through 10K.

Figure 11:
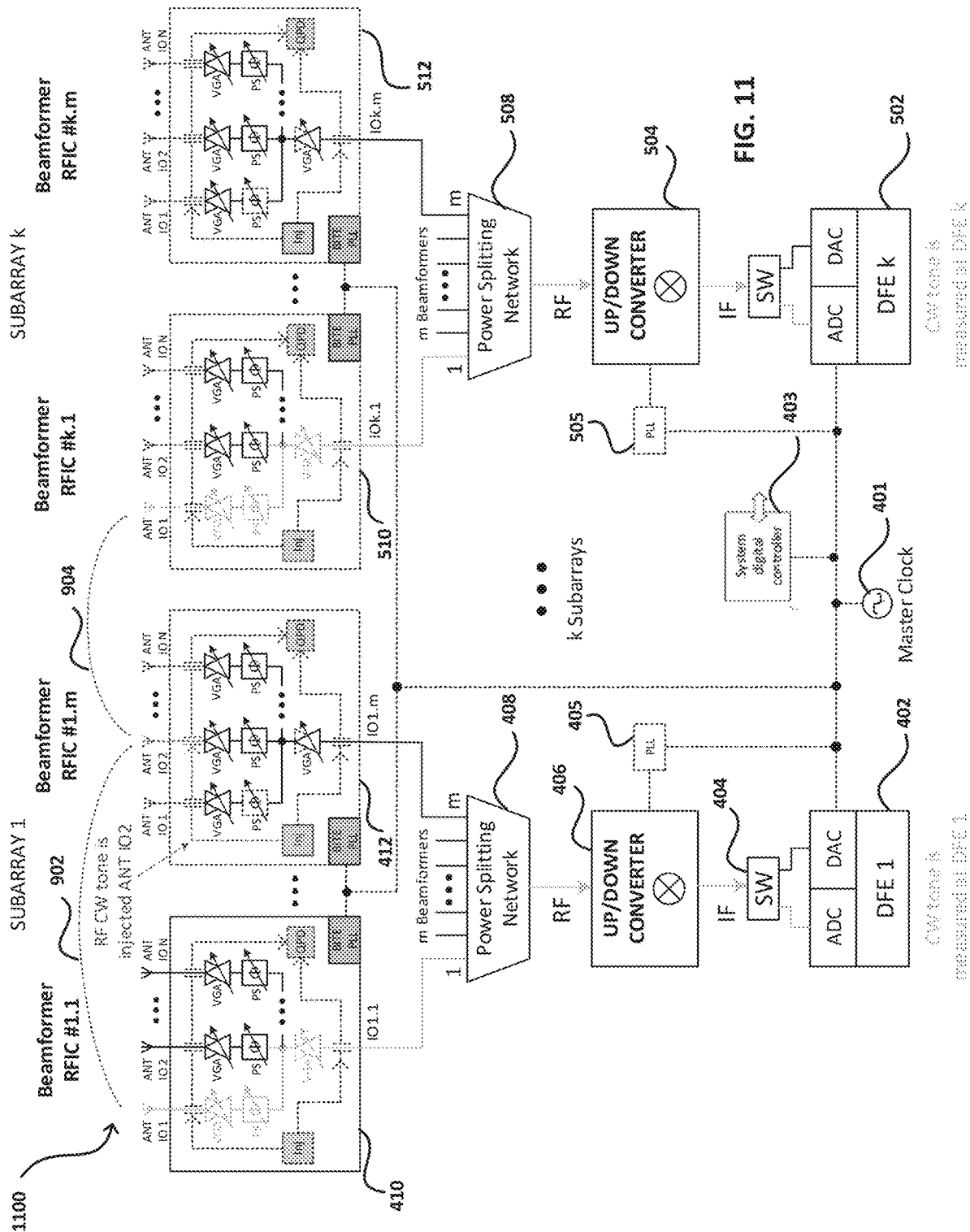
FIG. 11 is a diagram of a beamforming phased array system configured for a receive mode calibration method, according to an embodiment.

FIG. 11 is a diagram of a beamforming phased array system 1100 configured for a receive chain calibration method, according to an embodiment. Phased array system 1100 is substantially the same as phased array system 900, previously described, except that instead of being configured in the transmit mode, phased array system 1100 is configured in the receive mode so that the receive paths can be calibrated.

The following steps are illustrative of a receive mode calibration method for phased array system 1100 configured in the receive mode, according to an embodiment. The method is repeated until all of the receive channels are calibrated.

Step 1. The complete phased array system 1100 is configured to operate in the RX mode.

Step 2. A CW tone is injected at one of the antenna ports (ANT IO2 port of Beamformer RFIC1.m 412) using the on-chip injector Inj. All channels of the beamformer RFIC1.m 412 are set to maximum attenuation to avoid the injected CW tone traveling down the corresponding RX path through RFIC 412.

Step 3. By means of parasitic coupling 902 between antenna elements, the transmitted CW tone is received at antenna port ANT IO1 of beamformer RFIC1.1 410. This port is enabled, all other array channels are disabled or set to maximum attenuation in beamformer RFIC 410.

Step 4. The received CW tone travels from ANT IO1 of beamformer RFIC1.1 410 through the complete RX chain down to DFE1 402, where its phase and amplitude are measured.

Step 5. ANT IO1 channel of beamformer RFIC1.1 410 is then disabled and ANT IO1 of beamformer RFICk.1 510 is enabled. All other array channels are disabled or set to maximum attenuation.

Step 6. The received CW tone travels from ANT IO1 of beamformer RFICk.1 510 through the complete RX chain down to DFEk 502, where its phase and amplitude are measured.

Step 7. The difference between amplitude and phase measurements at steps 4 and 6 are the gain and phase corrections of the beamweights stored in the LUT, which is resident in the system digital controller 403, in an embodiment.

Step 8. Two channels are now calibrated, and the sequence repeats until all of the system channels are calibrated.

The method described above with respect to FIGS. 9, 10A through 10K, 11, and 12A through 12H allows calibration of the complete phased array system in RX and TX modes including antennas and digital frontends of different subarrays.

FIGS. 12A through 12H are sequential plan views of the antenna array during multiple applications of the receive mode calibration method of Figure ii.

FIG. 12A illustrates the upper left corner portion 1200A of the antenna array during the first pass of the receive mode calibration method. The CW tone is injected into channel T1 via an on-chip injector and measured on adjacent orthogonal channel M1 at the corresponding digital frontend.

FIG. 12B illustrates the same upper left corner portion of the antenna array, but is labeled 1200B to indicate that another step in the sequential calibration method is undertaken. The CW tone is now injected into channel T2 and measured on channel M2.

FIG. 12C illustrates upper left corner portion 1200C at a subsequent calibration step wherein the two previously measured channels can now be calibrated as channels C1 and C2. The same antenna element T3 is again used to transmit the CW tone, which is measured on channel M3.

FIG. 12D illustrates upper left corner portion 1200D at a subsequent calibration step wherein channel C3 is now calibrated. The same antenna element T4 is again used to transmit the CW tone, which is measured on channel M4.

FIG. 12E illustrates upper left corner portion 1200E at a subsequent calibration step wherein the CW tone is injected at channel T5 through the on-chip injector and previously calibrated channel C3 (now M5) is used to measure the phase at the corresponding digital frontend. Since channel C3 was previously calibrated the phase information can be transferred to a new group of neighboring channels.

FIG. 12F illustrates upper left corner portion 1200F at a subsequent calibration step wherein channels C1, C2, C3, and C4 are all calibrated, and the CW tone is again injected into channel T6. The CW tone is then measured on adjacent orthogonal channel M6.

Figure 12H:
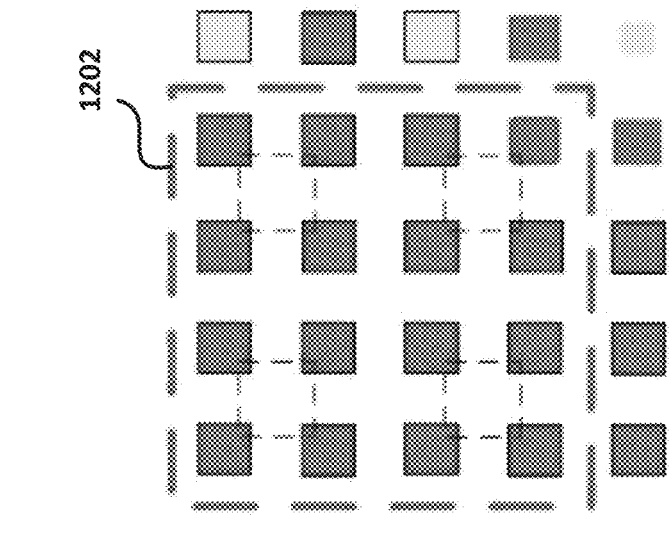
Figure 12G:
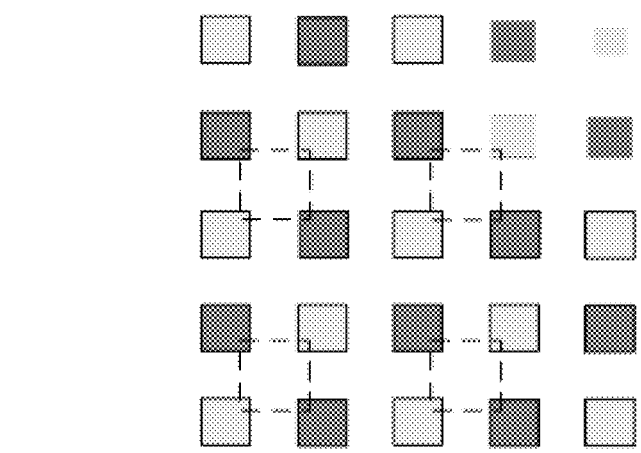

In FIG. 12G, antenna portion 1200G, all of the first half of channels in the phased array system are calibration to reveal a checkboard pattern of calibrated channels with adjacent orthogonal non-calibrated channels.

In FIG. 12H, antenna portion 1200H, the sequential calibration method is restarted at the upper left corner of the antenna array to "fill in" the uncalibrated channels such that a portion 1202 of the antenna array is completely calibrated. The sequential calibration method then continues until all uncalibrated channels in the phased array system are calibrated for each of the beams and the LUT is filled with all gain and phase entries for each beam. The phased array system is then calibrated in the receive mode.

In addition to the above described steps, additional steps can be performed in the receive mode. For example, the injector at one of the antenna ports is configured for maximum gain to provide the CW tone, while the VGA of this channel is at maximum attenuation. The VGA in an orthogonal channel is set for maximum gain and the corresponding phase shifter is set for maximum phase shift. The VGAs of all other channels are configured for maximum attenuation. By means of parasitic coupling the injected tone is received by an adjacent orthogonally oriented channel and the amplitude is measured using the digital frontend at the end of the receive chain of this channel. By reconfiguring such channel pairs across the entire array, the level matrix across the array can be measured. Based on these measurement results, the reference operational power level, also called a target level, is set to be the same for all channels and is selected to be a predetermined dB value above the weakest measured channel to ensure proper linear operating mode of the variable gain amplifiers (VGA) of the complete phased array system.

However, if "tapering" is used for the beams, particular power levels for individual elements will be pursued to achieve the beam tapering.

Additionally, the sequence shown in FIGS. 12A through 12H is only one example of many such sequences that could be conducted to calibrate all of the channels in the phased array system. However, all such sequences will have an associated step sequence comprising sending the CW tone over a single antenna element; measuring the phase and level at another channel via parasitic antenna coupling between adjacent orthogonal antenna elements; repeating these two steps in sequence wherein several different channels are measured using the same transmit channel; and passing on calibrated values to the rest of the array using previously calibrated channels.

Adjacent orthogonal channels (and corresponding antenna elements) are desirably used in the calibration method, according to embodiments described herein since the parasitic coupling between these adjacent orthogonal channels (antenna elements) is the strongest relative to other antenna elements. Parasitic coupling between diagonal antenna elements can also be used in embodiments (instead of or in combination with adjacent orthogonally coupled antenna elements), resulting in various other antenna element to antenna element calibration sequences and geometrical calibration patterns not shown in FIGS. 12A through 12H.

Figure 13:
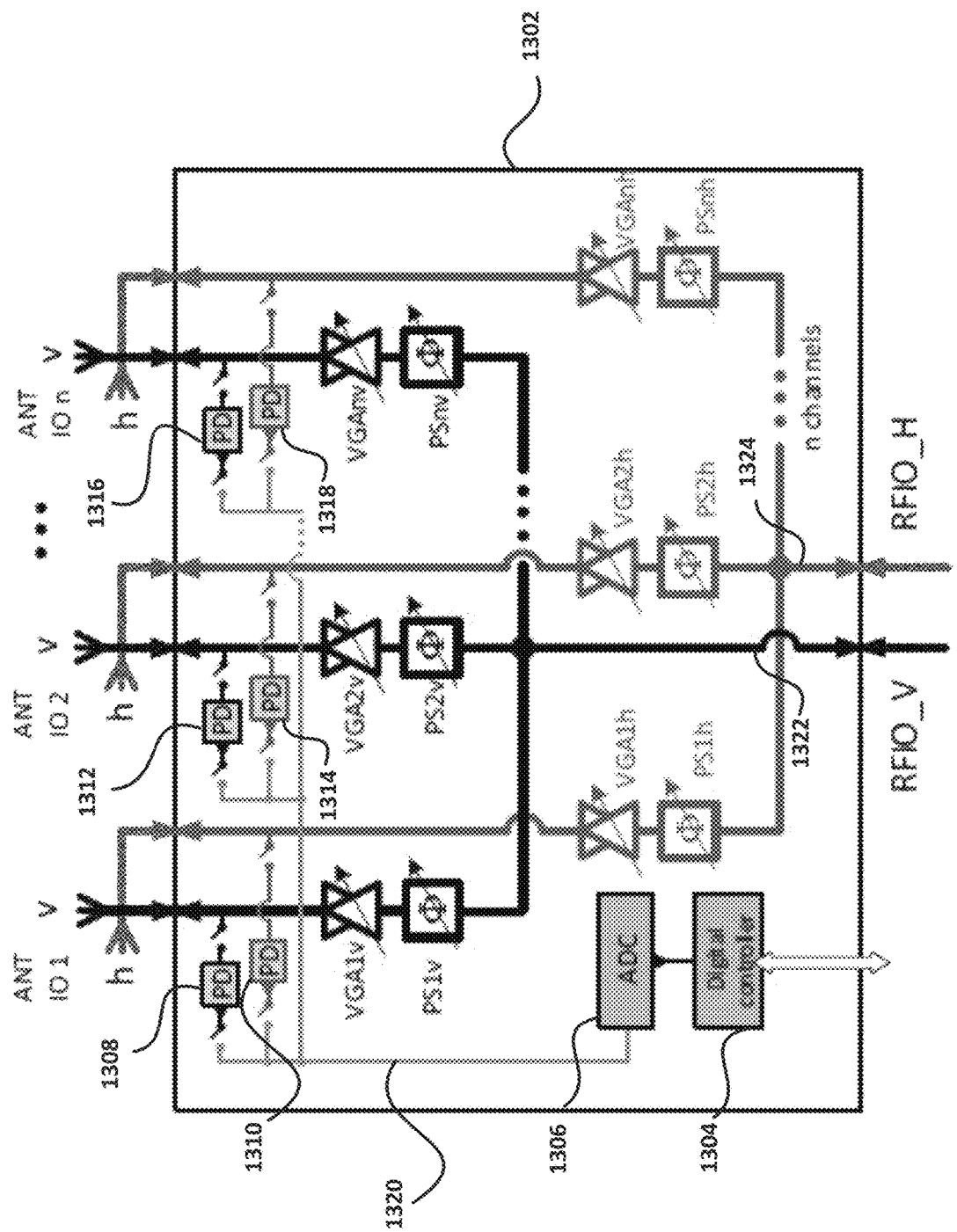
FIG. 13 is a block diagram of a beamformer integrated circuit for use in a dual-polarized beamforming phased array system, according to an embodiment.

FIG. 13 is a block diagram of a beamformer integrated circuit 1302 for use in a dual-polarized beamforming phased array system, separately described below, according to an embodiment. For example, in embodiment phased array stems, vertically and horizontally mounted antenna elements can used for sensing correspondingly vertically and horizontally polarized waves. The dual polarized architecture requires twice as many channels as there are antennas.

Beamformer RF integrated circuit 1302 is coupled to a first plurality of vertical antenna elements ANT IO1 V, ANT IO2 V, through ANT IOn V, and a second plurality of horizontal antenna elements ANT IO1H, ANT IO2 H, through ANT IOn H. Beamformer RFIC 1302 includes an RF input/output RFIO$_V$ 1322 for the vertically polarized channels, and an RF input/output RFIO$_H$ 1324 for the horizontally polarized channels. A first plurality of bidirectional variable gain amplifiers VGA1$v$, VGA2$v$, through VGAn$v$ is coupled between the RF input/output 1322 and the vertical antenna elements, and a second plurality of bidirectional variable gain amplifiers VGA1$h$, VGA2$h$, through VGAn$h$ is coupled between the RF input/output 1324 and the horizontal antenna elements. Similarly, a first plurality of bidirectional phase shifters PS1$v$, PS2$v$, through PS$nv$ is coupled between the RF input/output 1322 and the vertical antenna elements, and a second plurality of bidirectional phase shifters PS1$h$, PS2$h$, through PS$nh$ is coupled between the RF input/output 1324 and the horizontal antenna elements.

As previously described for the single polarized embodiments, beamformer RFIC 1302 includes a digital controller 1304 for communicating with other components in the dual-polarized beamforming phased array system, and an ADC 1306 coupled between the digital controller 1304 and an analog bus 1320. A first plurality of phase detectors 1308, 1312, through 1316 is selectively coupled between the analog bus 1320 and the vertical antenna elements, and a second plurality of phase detectors 1310, 1314, through 1318 is selectively coupled between the analog bus 1320 and the horizontal antenna elements. In some embodiments, beamformer RFIC 1302 does not include an injector or a quadrature phase detector due to the manner in which the dual-polarization phased array system is calibrated, according to embodiments, which is described in further detail below.

Figure 14:
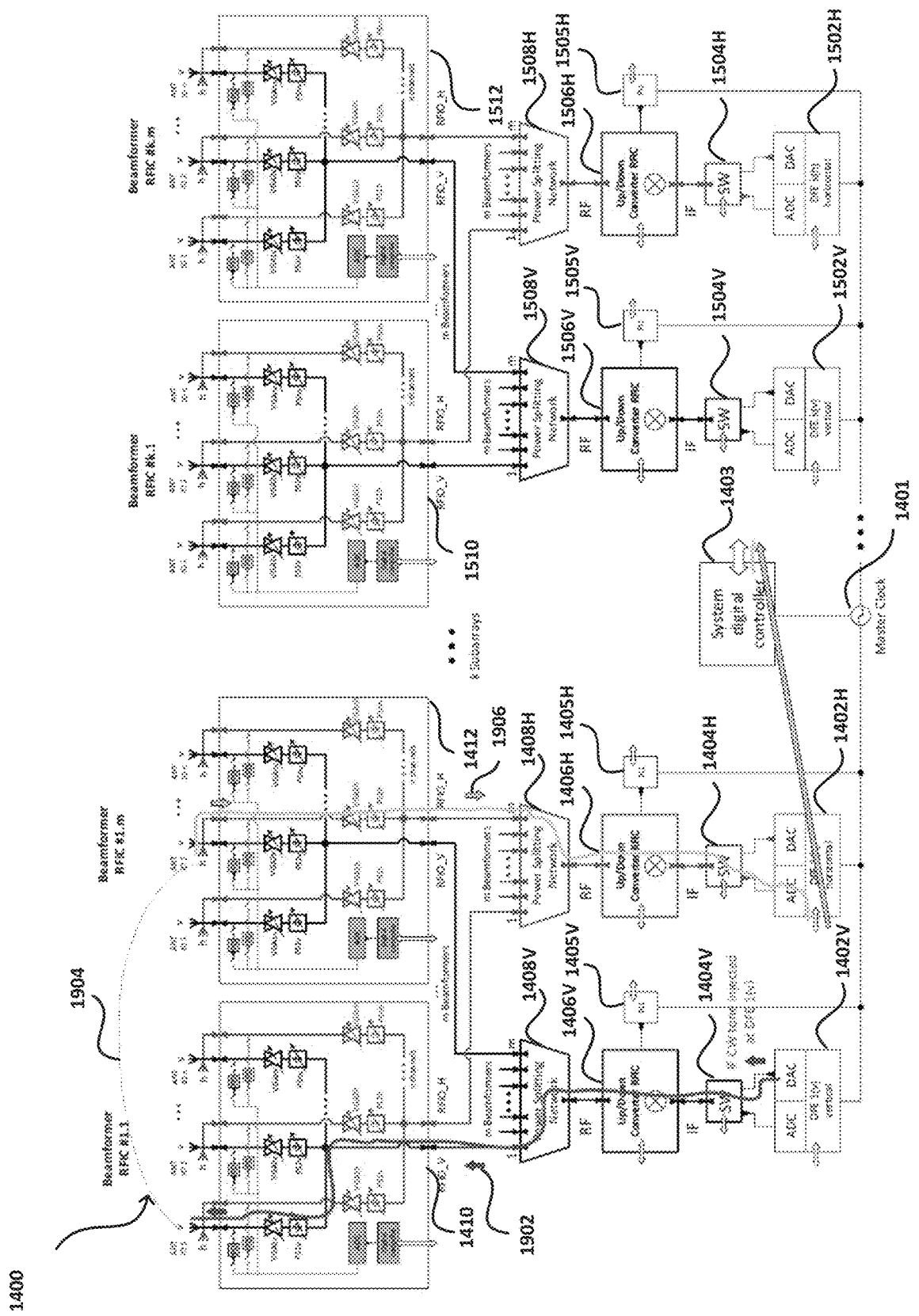
FIG. 14 is a block diagram of a dual polarized phased array system during a first transmit mode calibration step.
Figure 15:
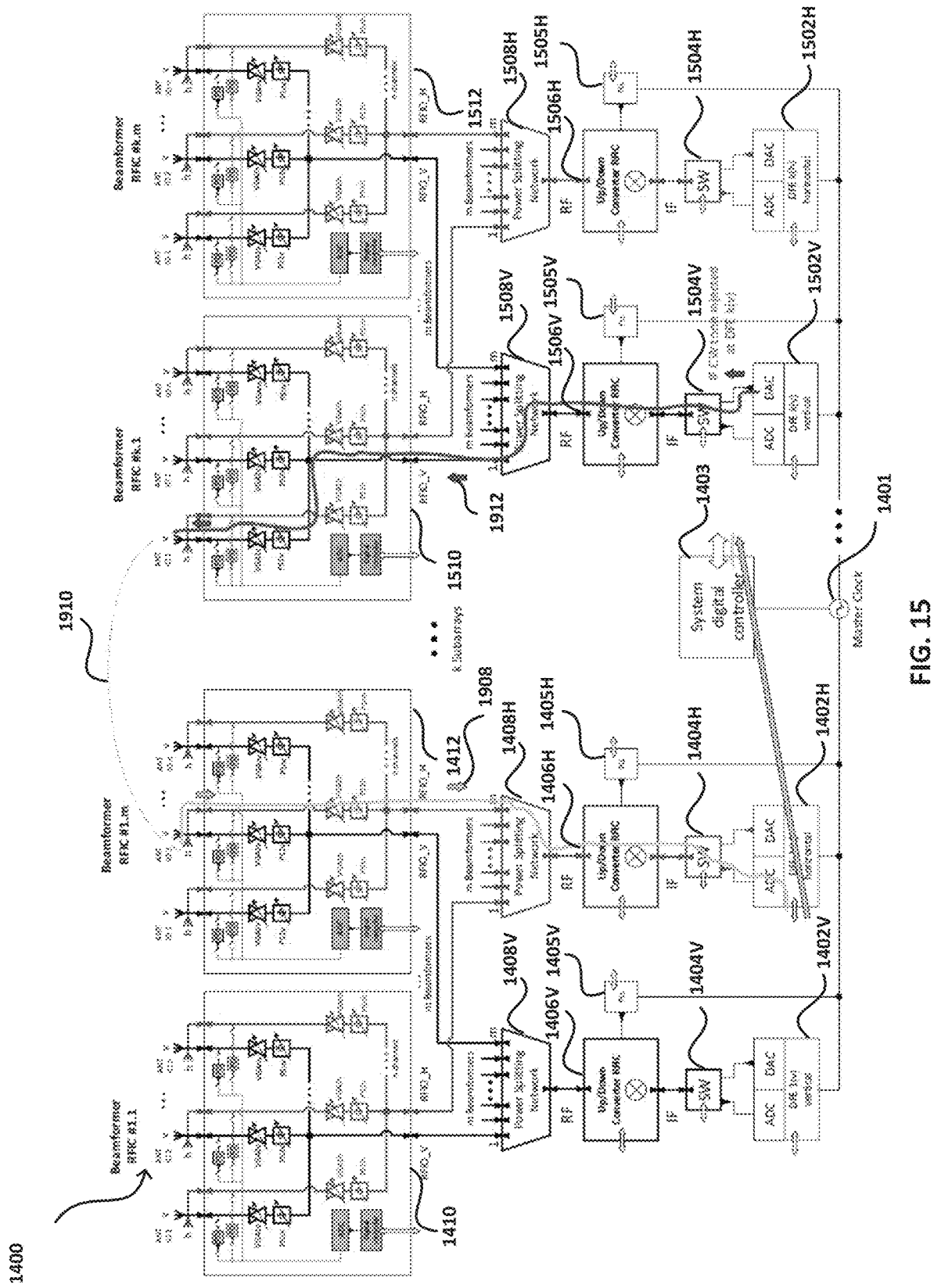
FIG. 15 is a block diagram of a dual polarized phased array system during a second transmit mode calibration step.
Figure 16:
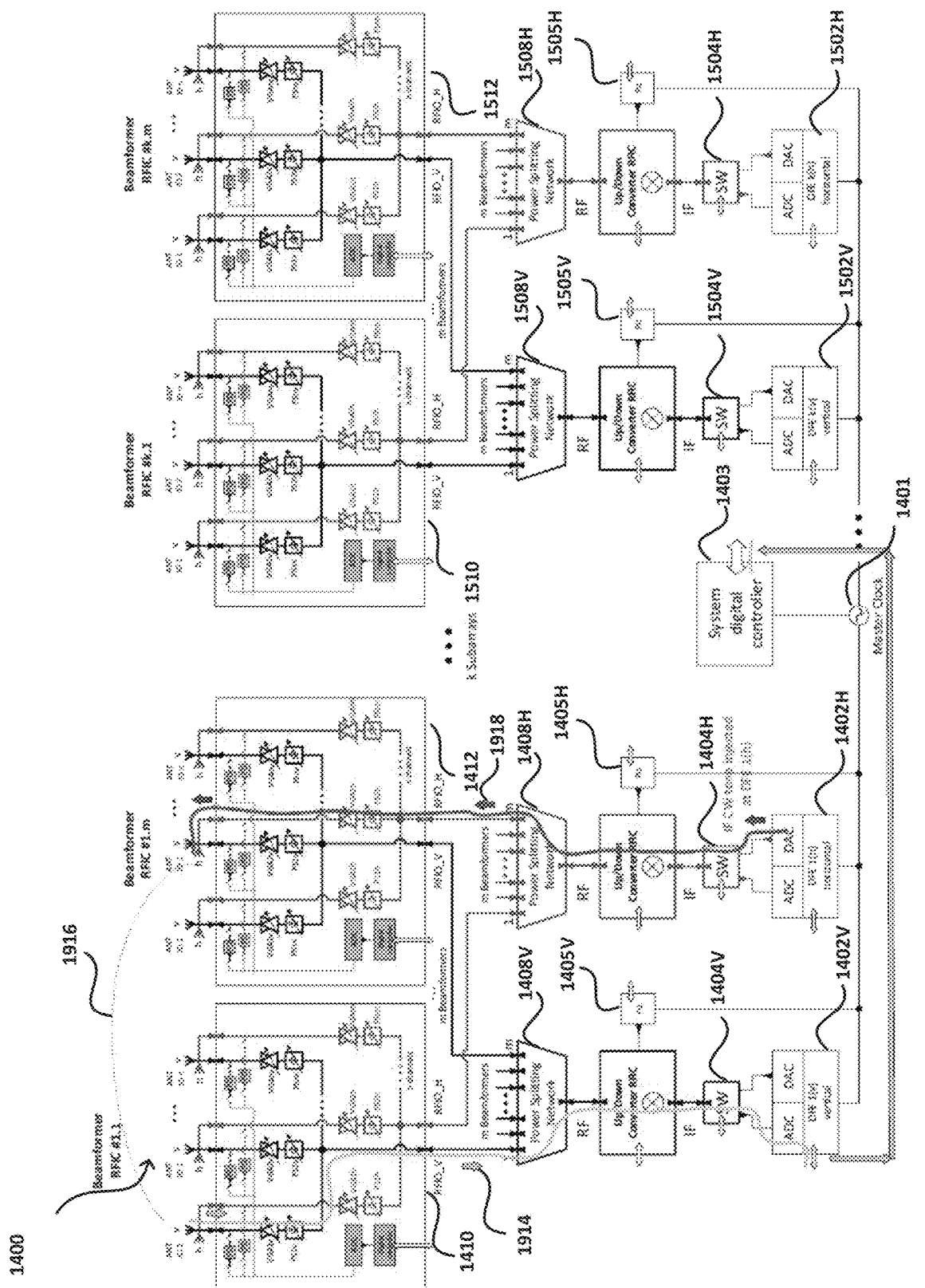
FIG. 16 is a block diagram of a dual polarized phased array system during a first receive mode calibration step.
Figure 17:
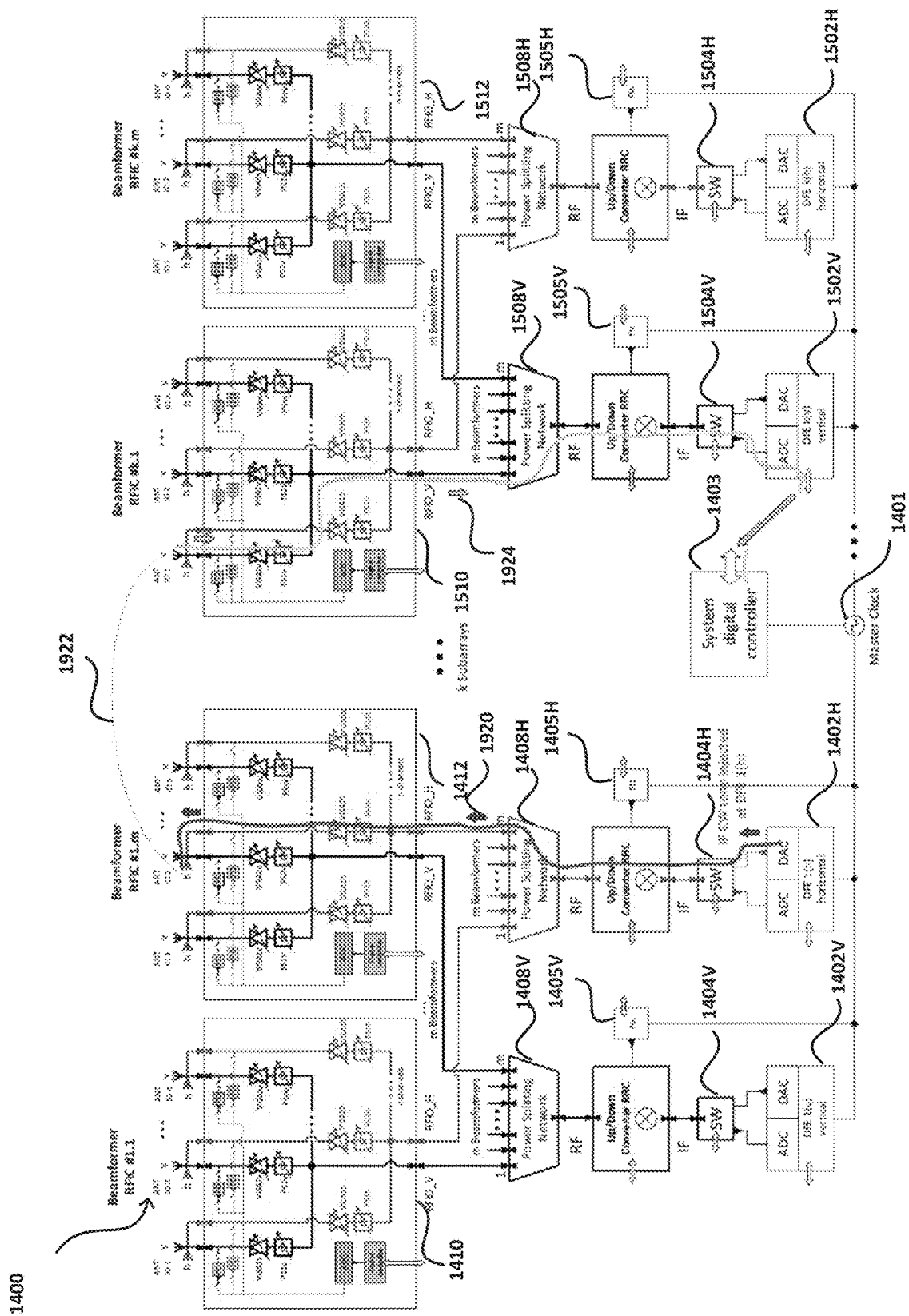
FIG. 17 is a block diagram of a dual polarized phased array system during a second receive mode calibration step.

A dual polarized phased array system 1400 using twice as many channels as antenna elements is shown in FIG. 14 (first transmit mode calibration step), FIG. 15 (second transmit mode calibration step), FIG. 16 (first receive mode calibration step), and FIG. 17 (second receive mode calibration step). Dual polarized phased array system 1400 includes a master clock generator 1401 that is resident in a system digital controller 1403 in an embodiment. System digital controller 1403 includes a digital bus for communicating with components in dual polarized phased array system 1400. The remaining components in phased array system are described in series from the digital frontends that are in turn coupled to additional components up to and including the vertical and horizontal antenna elements. A first subarray chain includes a vertical digital frontend 1402V and a horizontal digital frontend 1402H. A last subarray chain includes a vertical digital fronted 1502V and a horizontal digital frontend 1502H. The first subarray chain also includes a vertical switch 1404V, a vertical up/down converter 1406V, and a vertical power splitting network 1408V. The first subarray chain also includes a horizontal switch 1404H, a horizontal up/down converter 1406H, and a power splitting network 1408H. The last subarray chain also includes a vertical switch 1504V, a vertical up/down converter 1506V, and a vertical power splitting network 1508V. The last subarray chain also includes a horizontal switch 1504H, a horizontal up/down converter 1506H, and a power splitting network 1508H.

The first subarray chain terminates in beamformer RFICs 1410 through 1412, which are in turn coupled to the vertical and horizontal antenna elements associated with the first subarray. The last subarray chain terminates in beamformer RFICs 1510 through 1512, which are in turn coupled to the vertical and horizontal antenna elements associated with the last subarray.

In dual polarized phased array systems, horizontal and vertical polarization channels can operate simultaneously and independently from each other. Horizontal and vertical polarization channels can operate in different modes simultaneously (e.g. Horizontal in TX mode, and Vertical in RX mode). Simultaneously operation is advantageously used in embodiment calibration methods, and is not normally required for a radio operation in single phased array systems.

The calibration for the dual polarized phased array system is different from the BITE-based calibration used for single polarized arrays in that phase/amplitude measurements are performed in DFEs and not in the beamformer RFICs; and channels that undergo calibration operate in TX mode are of one polarization, and channels used for phase/amplitude measurements are always of the opposite polarization and operate in RX mode.

The dual polarized phase array system TX calibration steps are described below with respect to FIGS. 14 and 15, according to an embodiment method. FIG. 14 shows a vertical transmit path 1902 for a particular channel that will be calibrated, parasitic coupling 1904 from ANT IO1 V of beamformer RFIC 1410 to ANT IO1 H of beamformer RFIC 1412, and a first receive path 1906 for an adjacent orthogonal channel that will be used in the calibration method. FIG. 15 shows another vertical transmit path 1912 for another adjacent orthogonal channel that will be calibrated, parasitic coupling 1910 from ANT IO1 V of beamformer RFIC 1510 to ANT IO1 H of beamformer RFIC 1412, and a second receive path 1908 that will be used in the calibration method.

Step 1. Calibration of TX, vertical polarization part. Starting LUT values are VGA i.k.m.n=maximum gain and PS i.k.m.n=maximum phase shift.

Step 2. A CW tone at the frequency of calibration is generated by DFEs of vertical polarization one by one and fed into TX paths.

Step 3. Power level measurement. Power levels at each vertical polarization antenna port are measured using the on-chip PD, and results are temporarily stored in the system digital controller 1403. Only one channel being measured is enabled at every time instance.

Step 4. Reference Pout selection. Based on the results of step 3, a reference operation power level (target level), which is the same for all channels of vertical polarization, is selected to be certain number of dBs above the weakest channel measured in step 3 to ensure linear mode operation of the complete array. The LUT is updated for the first time, and the VGA 1.k.m.n setting values are updated accordingly. Steps 3 and 4 are desirable to avoid repeating the calibration routine if it is subsequently discovered that some channels are too weak to reach the required power level. This situation may then not be possible to correct and all other elements would then instead require a level reduction.

Step 5. Phase/amplitude calibration starts with any selected channel, e.g. on RFIC in the corner of the array as previously shown and described. A test CW tone is injected at one of DFEs 1402V of vertical polarization, transmitted using one (only one) channel as is shown in transmit path 1902 in FIG. 14. By means of parasitic coupling 1904 this tone is received by horizontally polarized channel of adjacent orthogonally oriented antenna element ANT IO2 V (corresponding channel is configured in RX mode). The received tone travels down to chain (receive path 1906) of this horizontal polarized channel to its DFE 1402H, where phase and amplitude of this tone are measured. All VGAs except the channels used for transmission (vertical polarization) and reception (horizontal polarization) are set to maximum attenuation.

Step 6. Step 5 repeats for another adjacent orthogonally oriented channel as previously shown and described, phase and amplitude of the received test tone are measured again on the same DFE of horizontal polarization channel 1402H.

Step 7. The difference between the measurement results in steps 5 and 6 is the error to be calibrated. The required corrections of LUT for the second channel (transmit path 1912 from step 6) are calculated and the LUT VGA and PS values are updated for this second channel. If no correction is needed (difference below the target error), the method moves to step 10.

Step 8. The measurement in step 6 is repeated with this updated LUT VGA and PS settings obtained in step 7.

Step 9. If the result in previous step 8 is below the target error, move to next step. If not, adjust VGA and PS settings in an iteration loop by an incremental amount until the target error is reached. The LUT is updated accordingly.

Step 10. Steps 6 through 9 are repeated for all orthogonally oriented adjacent channels as previously shown and described. Channels being calibrated are always vertical polarization channels, and phase/amplitude measurements are performed in the same DFE of horizontal polarization channel.

Step 11. One of the calibrated vertical polarization channels from previous steps is used to pass the calibrated phase value to the neighboring group of orthogonally oriented antenna elements as previously shown and described. This vertical polarization channel is reconfigured to transmit the CW tone and the horizontal polarization channel of adjacent antenna next to it is reconfigured in RX mode to enable phase/amplitude measurement with its DFE (similar to step 5).

Step 12. Steps 6 through 10 are repeated for the all other adjacent vertically polarized orthogonally oriented uncalibrated channels (with respect to the newly selected measurement channel).

Step 13. Steps 11-12 are repeated until half of the array vertically polarized channels organized in a chess-board pattern are calibrated as previously shown and described.

Step 14. Production test data or BITE/BIST (if available) on one of the beamformer RFICs is used to measure the phase/level difference between its two vertical polarization channels. One of these channels belongs to a group which was not calibrated during above steps.

Step 15. Steps 6 through 13 are repeated until second half of the array vertical polarization channels organized in a chess-board pattern are calibrated. At this point LUT entries for boresight beam of vertical polarization are updated.

Step 16. Steps 7 through 9 are repeated for every channel for all vertically polarized beams of complete codebook with the difference that the target phase/amplitude errors are replaced by the according progressive phase shifts and amplitudes required to obtain the needed beams.

Step 17. Steps 1 through 16 are repeated to calibrate all horizontal polarization channels. For this the roles of vertical and horizontal polarization channels described in steps 1 through 16 are interchanged: now TX channels to be calibrated are of horizontal polarization and the RX paths used for calibration (phase/amplitude measurement) are of vertical polarization.

Step 18. After step 17 is finalized for every beam in the codebook (i.e. LUT is filled with calibrated settings), TX calibration of the array is completed.

If tapering is used for the beams, particular power levels for individual elements will be pursued (not equal levels for all elements as described in the algorithm above).

The calibration sequence does not have to proceed exactly as described herein, but include defining how phase/level information is transferred from chip to chip and from channel to channel; sending a CW tone over single antenna element; measuring the phase/level of the CW tone at another channel via parasitic antenna coupling; and repeating the above two steps in a sequence where several different channels are measured using another the same channel; passing on calibrated phase values to the rest of the array using the previous steps.

Coupling between diagonally coupled antenna elements can also be used (instead or combined with orthogonally coupled elements) ending up in various possible element-to-element calibration sequences and geometrical patterns.

The RX mode calibration for calibrating receive channels of a dual polarized phased array system is described below with respect to FIGS. 16 and 17. FIG. 16 shows a first transmit path 1918 from DFE 1402H through horizontal antenna element ANT IO2 H coupled to beamformer RFIC 1412, parasitic coupling 1916 between horizontal antenna element ANT IO2 H coupled to beamformer RFIC 1412 to vertical antenna element ANT IO2 V coupled to beamformer RFIC 1410, and first receive path 1914 terminating in DFE 1402V in communication with digital system controller 1403. FIG. 17 shows a second transmit path 1920 from DFE 1402H through horizontal antenna element ANT IO2 H coupled to beamformer RFIC 1412, parasitic coupling 1922 between horizontal antenna element ANT IO2 H coupled to beamformer RFIC 1412 to vertical antenna element ANT IO2 V coupled to beamformer RFIC 1510, and a second receive path 1924 terminating in DFE 1502V in communication with digital system controller 1403.

Differences of the dual polarized phased array system calibration method with the BITE-based calibration method for single polarized arrays include: injection is performed in the DFEs; and channels that undergo calibration operate in RX mode and are of one polarization, while channels used for injection are always of the opposite polarization and operate in TX mode.

The system RX calibration steps are described below for two receive channels as is shown in FIGS. 16 and 17.

Step 1. Calibration of RX, vertical polarization part. Starting LUT values are VGA i.k.m.n=maximum gain and PS i.k.m.n=maximum phase shift.

Step 2. Gain level measurement: configure one horizontal polarization channel in TX mode (transmit path 1918) and inject a CW tone with its DFE 1402H, channel settings are obtained from TX calibration step of boresight beam for this channel; configure the VGA in adjacent orthogonal RX channel (receive path 1914) of vertical polarization for maximum gain, its phase shifter to maximum phase shift; VGAs of all other channels are configured to maximum attenuation; by means of parasitic coupling 1916 the tone is received by adjacent orthogonally oriented RX channel of vertical polarization (receive path 1914), and the amplitude of the received tone is measured using the DFE 1402V at the end of RX chain of this channel. By reconfiguring such channel pairs across the entire array, the level matrix (per each channel) is measured. (Pin of the received IF tone).

Step 3. Reference Pin selection. Based on the results of step 2, reference operation power level (target level), is the same for all vertical polarization RX channels is selected to be a certain number of dBs above the weakest channel (to ensure equalized levels across array). The LUT is updated first time, and at this stage VGA 1.k.m.n setting values are updated accordingly. Steps 2 and 3 are desirable to avoid repeating the calibration routine if it is discovered in subsequent steps that some channels are too weak to reach the required power level, which is then not possible to correct and all other elements require level reduction instead.

Step 4. Phase/amplitude calibration starts with any selected channel, e.g. on RFIC in the corner of the array, with configuration as described in step 2; the phase and amplitude of received CW tone, travelled through one adjacent orthogonally oriented RX channel (receive path 1914) of vertical polarization are measured in corresponding DFE 1402V.

Step 5. Step 4 repeats for another adjacent orthogonally oriented RX channel (receive path 1924) of vertical polarization, phase and amplitude of the received test tone are measured again.

Step 6. The difference between the measurement results in steps 4 and 5 is the error to be calibrated. The required corrections of the LUT for the second channel from step 5 are calculated and LUT VGA and PS values are updated for this second channel. If no correction is needed (difference below the target error), the calibration method moves to step 9.

Step 7. The measurement in step 5 is repeated with this updated LUT VGA and PS settings obtained in step 6.

Step 8. If the result in previous step 7 is below the target error, the calibration method moves to the next step. If not, adjust VGA and PS setting in iteration loop until the target error is reached. Update the LUT accordingly.

Step 9. Steps 5 through 8 are repeated for all orthogonally oriented adjacent channels of vertical polarization.

Step 10. One of the calibrated channels from previous steps is used to pass the calibrated phase value to the neighboring group of orthogonally oriented antenna elements. This RX vertical polarization channel is reconfigured to receive the CW tone and the adjacent TX horizontal polarization channel next to it (not used in previous steps) is reconfigured to transmit the injected CW tone (similar to step 4).

Step 11. Steps 5 to 9 are repeated for the all other adjacent orthogonally oriented uncalibrated RX vertical polarization channels (towards newly selected measurement channel).

Step 12. Steps 10-11 are repeated until half of the array RX vertical polarization channels organized in a chess-board pattern are calibrated.

Step 13. Production test data or BITE/BIST (if available) on one of the Beamformer RFICs is used to measure phase/level difference between its two RX vertical polarization channels. One of these channels belongs to a group which was not calibrated during above steps.

Step 14. Steps 5 12 are repeated until a second half of the array elements organized in a chess-board pattern are calibrated. At this point LUT entries for boresight beam of vertical polarization are updated.

Step 15. Steps 6 8 are repeated for every channel for all beams of complete RX vertical polarization codebook with the difference that the target phase/amplitude errors are replaced by the according progressive phase shifts and amplitudes required to obtain the needed beams.

Step 16. Steps 1 through 15 are repeated to calibrate all RX horizontal polarization channels. For this step, the roles of vertical and horizontal polarization channels described in steps 1 through 16 are interchanged: now RX channels to be calibrated are of horizontal polarization and the TX paths used for tone injection are of vertical polarization.

Step 17. After step 16 is finalized for every beam in the codebook (i.e. LUT is filled with calibrated settings), RX calibration of the array is completed.

If tapering is used for the beams, particular power levels for individual elements will be pursued (not same levels for all elements as described in the algorithm above).

The sequence of the calibration method does not have to be exactly as described here, but include define how phase/level information is transferred from chip to chip and from channel to channel; sending the CW tone over a single antenna element; measuring its phase/level at another channel via parasitic antenna coupling; repeating the above two steps in a sequence where several different channels are measured using the same channel; and passing on calibrated phase values to the rest of the array using the previous steps.

Coupling between diagonally coupled elements can also be used (instead or combined with orthogonally coupled elements) ending up in various possible element-to-element calibration sequences and geometrical patterns.

It is an advantage that embodiments of the calibration method described herein for a phased array system are highly efficient and can be performed in a reasonable amount of time.

It is a further advantage that embodiments of the calibration method described herein do not require an anechoic antenna chamber or additional measurement equipment.

It is a further advantage that embodiments of the calibration method can be adapted to calibrate the phased array system over time, such that aging effects of the system can be calibrated out for maximum performance.

If is a further advantage that embodiments of the calibration method can be configured to calibrate arrays for systems using multiple beamformer RFICs.

It is a further advantage that embodiments of the calibration method can calibrate out differences among transmission lines that connecting beamforming RFICs to corresponding antenna elements.

It is a further advantage that embodiments of the calibration method are not limited to certain subarray configurations, and is applicable to phased array systems including a single digital frontend input.

It is a further advantage that embodiments of the calibration method can be performed on systems including large subarray sizes.

Example embodiments of the present invention are summarized here. Other embodiments can also be understood from the entirety of the specification and the claims filed herein.

Example 1

According to an embodiment, a transmit chain calibration method of a phased array system comprises injecting a tone into a first antenna element of an antenna array of the phased array system; receiving the tone by a second antenna element of the antenna array of the phased array system through parasitic coupling between the first antenna element and the second antenna element; measuring a first phase difference between the tone injected into the first antenna element and the tone received by the second antenna element; injecting the tone into a third antenna element of the antenna array of the phased array system; receiving the tone by the second antenna element of the antenna array of the phased array system through parasitic coupling between the third antenna element and the second antenna element; and measuring a second phase difference between the tone injected into the third antenna element and the tone received by the second antenna element.

Example 2

The method of Example 1, further comprising calculating a phase correction between the first phase difference and the second phase difference, and storing the phase correction in a lookup table of the phased array system.

Example 3

The method of any of the previous examples, wherein the phase correction is used to adjust a phase shifter of a first channel associated with the first antenna element, or a phase shifter of a third channel associated with the third antenna element.

Example 4

The method of any of the previous examples, wherein the tone injected into the first antenna element travels through a complete transmit chain in a first channel from a digital frontend up to the first antenna element, and wherein the tone injected into the third antenna element travels through a complete transmit chain in a third channel from a digital frontend up to the third antenna element.

Example 5

The method of any of the previous examples, wherein the first phase difference and the second phase difference are measured by a phase detector of a beamformer circuit of the phased array system associated with the second antenna element.

Example 6

The method of any of the previous examples, wherein the first and third antenna elements are orthogonal to the second antenna element.

Example 7

The method of any of the previous examples, further comprising calibrating neighboring groups of orthogonally oriented antenna elements by sequentially injecting the tone into at least one of the neighboring groups of orthogonally oriented antenna elements, receiving the tone by at least one of the neighboring groups of orthogonally oriented antenna elements, and using phase information from previously calibrated channels until all channels in the phased array system are calibrated.

Example 8

According to an embodiment, a receive chain calibration method of a phased array system comprises injecting a tone into a first antenna element of an antenna array of the phased array system; receiving the tone by a second antenna element of the antenna array of the phased array system through parasitic coupling between the first antenna element and the second antenna element; measuring a first phase difference between the tone injected into the first antenna element and the tone received by the second antenna element; receiving the tone by a third antenna element of the antenna array of the phased array system through parasitic coupling between the first antenna element and the third antenna element; and measuring a second phase difference between the tone injected into the first antenna element and the tone received by the third antenna element.

Example 9

The method of Example 8, further comprising calculating a phase correction between the first phase difference and the second phase difference, and storing the phase correction in a lookup table of the phased array system.

Example 10

The method of any of the previous examples, wherein the phase correction is used adjust a phase shifter of a second channel associated with the second antenna element, or a phase shifter of a third channel associated with the third antenna element.

Example 11

The method of any of the previous examples, wherein the tone injected into the first antenna element via an injector in a beamformer circuit of the phased array system associated with the first antenna.

Example 12

The method of any of the previous examples, wherein the first phase difference is measured by a digital frontend in a second channel associated with the second antenna element and the second phase difference is measured by a digital frontend in a third channel associated with the third antenna element.

Example 13

The method of any of the previous examples, wherein the second and third antenna elements are orthogonal to the first antenna element.

Example 14

The method of any of the previous examples, further comprises calibrating neighboring groups of orthogonally oriented antenna elements by sequentially injecting the tone into at least one of the neighboring groups of orthogonally oriented antenna elements, receiving the tone by at least one of the neighboring groups of orthogonally oriented antenna elements, and using phase information from previously calibrated channels until all channels in the phased array system are calibrated.

Example 15

According to an embodiment, a calibration method for a phased array system comprises sequentially injecting a tone into a first plurality of antenna elements of an antenna array; receiving the tone by a second plurality of antenna elements of the antenna array through parasitic coupling between the first plurality of antenna elements and the second plurality of antenna elements; measuring a plurality of phase errors between the first plurality of antenna elements and the second plurality of antenna elements; populating a lookup table with the plurality of phase errors; and calibrating a plurality of phase shifters associated with a plurality of channels in the phased array system using the plurality of phase errors in the lookup table.

Example 16

The calibration method of Example 15, wherein the calibration method is used to calibrate a plurality of receive chains in the phased array system.

Example 17

The calibration method of any of the previous examples, wherein the calibration method is used to calibrate a plurality of transmit chains in the phase array system.

Example 18

The calibration method of any of the previous examples, wherein measuring the plurality of errors between the first plurality of antenna elements and the second plurality of antenna elements comprises using phase error information from previously calibrated channels.

Example 19

The calibration method of any of the previous examples, wherein at least one of the first plurality of antenna elements is orthogonal to at least one of the second plurality of antenna elements.

Example 20

The calibration method of any of the previous examples, wherein the phased array system comprises a plurality of beamformer circuits for injecting the tone in a first mode of operation, and for measuring the plurality of phase errors in a second mode of operation.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transmit chain calibration method of a phased array system comprising:
   injecting a tone into a first antenna element of an antenna array of the phased array system;
   receiving the tone by a second antenna element of the antenna array of the phased array system through parasitic coupling between the first antenna element and the second antenna element;
   measuring a first phase difference between the tone injected into the first antenna element and the tone received by the second antenna element;
   injecting the tone into a third antenna element of the antenna array of the phased array system;
   receiving the tone by the second antenna element of the antenna array of the phased array system through parasitic coupling between the third antenna element and the second antenna element; and
   measuring a second phase difference between the tone injected into the third antenna element and the tone received by the second antenna element.

2. The method of claim 1, further comprising calculating a phase correction between the first phase difference and the second phase difference, and storing the phase correction in a lookup table of the phased array system.

3. The method of claim 2, wherein the phase correction is used to adjust a phase shifter of a first channel associated with the first antenna element, or a phase shifter of a third channel associated with the third antenna element.

4. The method of claim 1, wherein injecting the tone into the first antenna element comprises providing the tone through a complete transmit chain in a first channel from a digital frontend up to the first antenna element, and wherein injecting the tone into the third antenna element comprises providing the tone through a complete transmit chain in a third channel from a digital frontend up to the third antenna element.

5. The method of claim 1, wherein measuring the first phase difference and the second phase difference comprises using a phase detector of a beamformer circuit of the phased array system associated with the second antenna element.

6. The method of claim 1, wherein the first and third antenna elements are orthogonal to the second antenna element.

7. The method of claim 6, further comprising calibrating neighboring groups of orthogonally oriented antenna elements by sequentially injecting the tone into at least one of the neighboring groups of orthogonally oriented antenna elements, receiving the tone by at least one of the neighboring groups of orthogonally oriented antenna elements, and using phase information from previously calibrated channels until all channels in the phased array system are calibrated.

8. A receive chain calibration method of a phased array system comprising:

injecting a tone into a first antenna element of an antenna array of the phased array system;

receiving the tone by a second antenna element of the antenna array of the phased array system through parasitic coupling between the first antenna element and the second antenna element;

measuring a first phase difference between the tone injected into the first antenna element and the tone received by the second antenna element;

receiving the tone by a third antenna element of the antenna array of the phased array system through parasitic coupling between the first antenna element and the third antenna element; and measuring a second phase difference between the tone injected into the first antenna element and the tone received by the third antenna element.

9. The method of claim 8, further comprising calculating a phase correction between the first phase difference and the second phase difference, and storing the phase correction in a lookup table of the phased array system.

10. The method of claim 9, wherein the phase correction is used adjust a phase shifter of a second channel associated with the second antenna element, or a phase shifter of a third channel associated with the third antenna element.

11. The method of claim 8, wherein the injecting the tone into the first antenna element comprises injecting the tone via an injector in a beamformer circuit of the phased array system associated with the first antenna.

12. The method of claim 8, wherein measuring the first phase difference comprises measuring the first phase difference by a digital frontend in a second channel associated with the second antenna element and measuring the second phase difference by a digital frontend in a third channel associated with the third antenna element.

13. The method of claim 8, wherein the second and third antenna elements are orthogonal to the first antenna element.

14. The method of claim 8, further comprises calibrating neighboring groups of orthogonally oriented antenna elements by sequentially injecting the tone into at least one of the neighboring groups of orthogonally oriented antenna elements, receiving the tone by at least one of the neighboring groups of orthogonally oriented antenna elements, and using phase information from previously calibrated channels until all channels in the phased array system are calibrated.

15. A calibration method for a phased array system, the method comprising:

sequentially injecting a tone into a first plurality of antenna elements of an antenna array;

receiving the tone by a second plurality of antenna elements of the antenna array through parasitic coupling between the first plurality of antenna elements and the second plurality of antenna elements;

measuring a plurality of phase errors between the first plurality of antenna elements and the second plurality of antenna elements;

populating a lookup table with the plurality of phase errors; and calibrating a plurality of phase shifters associated with a plurality of channels in the phased array system using the plurality of phase errors in the lookup table.

16. The calibration method of claim 15, wherein the calibration method is used to calibrate a plurality of receive chains in the phased array system.

17. The calibration method of claim 15, wherein the calibration method is used to calibrate a plurality of transmit chains in the phase array system.

18. The calibration method of claim 15, wherein measuring the plurality of errors between the first plurality of antenna elements and the second plurality of antenna elements comprises using phase error information from previously calibrated channels.

19. The calibration method of claim 15, wherein at least one of the first plurality of antenna elements is orthogonal to at least one of the second plurality of antenna elements.

20. The calibration method of claim 15, wherein the phased array system comprises a plurality of beamformer circuits for injecting the tone in a first mode of operation, and for measuring the plurality of phase errors in a second mode of operation.

* * * * *